(12) United States Patent
Mulzer et al.

(10) Patent No.: US 11,746,254 B2
(45) Date of Patent: Sep. 5, 2023

(54) TUNABLE REFRACTIVE INDEX POLYMERS

(71) Applicant: Rohm and Haas Electronic Materials LLC, Marlborough, MA (US)

(72) Inventors: Catherine Mulzer, Grafton, MA (US); Anastasia L. Patterson, Cambridge, MA (US); Charles R. Kinzie, Boston, MA (US); Brian Litchfield, West Boylston, MA (US); Christopher D. Gilmore, Natick, MA (US); Bethany L. Seckman, Worcester, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 303 days.

(21) Appl. No.: 17/092,767

(22) Filed: Nov. 9, 2020

(65) Prior Publication Data

US 2021/0147707 A1   May 20, 2021

Related U.S. Application Data

(60) Provisional application No. 62/937,481, filed on Nov. 19, 2019.

(51) Int. Cl.

| | |
|---|---|
| *C09D 149/00* | (2006.01) |
| *C08K 5/1515* | (2006.01) |
| *C08F 238/00* | (2006.01) |
| *C08K 5/3445* | (2006.01) |
| *G02B 1/115* | (2015.01) |
| *H10K 50/00* | (2023.01) |
| *H10K 59/00* | (2023.01) |

(52) U.S. Cl.
CPC .......... *C09D 149/00* (2013.01); *C08F 238/00* (2013.01); *C08K 5/1515* (2013.01); *G02B 1/115* (2013.01); *H10K 50/00* (2023.02); *C08K 5/3445* (2013.01); *H10K 59/00* (2023.02)

(58) Field of Classification Search
CPC .. C09D 149/00; C08F 238/00; C08G 2261/46
See application file for complete search history.

(56) References Cited

U.S. PATENT DOCUMENTS

| | | | |
|---|---|---|---|
| 5,965,679 A | 10/1999 | Godschalx et al. | |
| 6,676,859 B2 | 1/2004 | Hartley et al. | |
| 7,002,754 B2 | 2/2006 | Baer et al. | |
| 7,816,017 B2 | 10/2010 | Funahashi et al. | |
| 8,465,848 B2 | 6/2013 | Smith | |
| 8,576,486 B2 | 11/2013 | Hayashibe et al. | |
| 8,653,512 B2 | 2/2014 | Auman et al. | |
| 9,112,157 B2 | 8/2015 | Brown et al. | |
| 9,481,810 B2* | 11/2016 | Gilmore | C08G 61/10 |
| 9,752,051 B2* | 9/2017 | Kang | C08G 61/12 |
| 9,868,820 B2* | 1/2018 | Gilmore | C08L 65/02 |
| 10,036,886 B2 | 7/2018 | Tabirian et al. | |
| 10,374,166 B2 | 8/2019 | Hatakeyama et al. | |
| 10,790,146 B2* | 9/2020 | Yamada | G03F 7/091 |
| 10,894,848 B2* | 1/2021 | Kinzie | C08G 61/10 |
| 11,042,093 B2* | 6/2021 | Cameron | C08G 61/10 |
| 2003/0099838 A1 | 5/2003 | Cho et al. | |
| 2004/0053033 A1* | 3/2004 | Niu | C07C 49/84 |
| | | | 257/E23.167 |
| 2006/0127698 A1 | 6/2006 | Tokailin et al. | |
| 2007/0052350 A1 | 3/2007 | Su et al. | |
| 2010/0032658 A1 | 2/2010 | Lee et al. | |
| 2014/0120469 A1 | 5/2014 | Prokopowicz et al. | |
| 2016/0060393 A1 | 3/2016 | Gilmore et al. | |
| 2017/0009006 A1 | 1/2017 | Ding et al. | |
| 2018/0069182 A1 | 3/2018 | Hatakeyama et al. | |
| 2018/0162992 A1 | 6/2018 | Gilmore et al. | |
| 2019/0058124 A1 | 2/2019 | Hatakeyama et al. | |
| 2019/0219543 A1* | 7/2019 | Gilmore | C08L 39/04 |
| 2020/0017678 A1* | 1/2020 | Lim | H01L 21/0271 |
| 2020/0176680 A1 | 6/2020 | Hatakeyama et al. | |
| 2020/0266350 A1 | 8/2020 | Hatakeyama et al. | |

FOREIGN PATENT DOCUMENTS

| | | | |
|---|---|---|---|
| JP | 2001106880 | | 4/2001 |
| WO | 2003068825 A2 | | 8/2003 |

OTHER PUBLICATIONS

Kumar, Uday et al., Hybrid polyimide-polyphenylenes by the Diels-Alder polymerization between biscyclopentadienones and ethynylterminatedimides, ACS Symposium Series, 614 (Microelectronics Technology), 518-526, 1995.

Park, et al, "Optical characteristics of refractive index-matching diffusion layer in organic light-emitting diodes", Scientific Reports, 2019, vol. 9, pp. 8690.

Yahya, et al, "Curing methods yield multiple refractive index of benzocyclobutene polymer film", International Scholarly and Scientific Research & Innovation, 2011, vol. 5, No. 2, p. 163.

Gustafsson, et al, "Flexible Light-Emitting Diodes Made from Soluble Conducting Polymers", Nature, 1992, vol. 357, p. 477.

Kim, et al, "A Facile Route to Efficient, Low-Cost Flexible Organic Light-Emitting Diodes: Utilizing the High Refractive Index and Built-In Scattering Properties of Industrial-Grade PEN Substrates", Adv. Mat.; 2015, vol. 27, p. 1624.

Wang, "Photoconductive Polymers", Kirk Othmer Encyclopedia of Chemical Technology; 1996, vol. 18, p. 837.

\* cited by examiner

*Primary Examiner* — Stephen E Rieth
(74) *Attorney, Agent, or Firm* — G. Creston Campbell

(57) ABSTRACT

Disclosed is a coating comprising a polymeric layer, wherein the polymeric layer comprises a reaction product of a first monomer comprising two or more aromatic acetylene groups and a second monomer comprising two or more cyclopentadienone groups, or a cured product of the reaction product. The coating may or may not additionally contain a crosslinker and/or a thermal acid generator. Optical thin films made from the coatings exhibit refractive indices that make them useful as interlayers for matching refractive indices between adjacent layers of display devices; thereby improving device output efficiency.

11 Claims, No Drawings

TUNABLE REFRACTIVE INDEX POLYMERS

BACKGROUND OF THE INVENTION

1. Field of the Disclosed and Claimed Inventive Concepts

The presently disclosed process(es), procedure(s), method(s), product(s), result(s), and/or concept(s) (collectively referred to hereinafter as the "present disclosure") relate generally to coatings and optical thin films prepared therefrom. In particular, polyarylene coatings and films are disclosed with properties that are well suited for electronics and displays applications.

2. Background and Applicable Aspects of the Presently Disclosed and Claimed Inventive Concept(s)

Materials for use in electronics and displays applications often have strict requirements in terms of their structural, optical, thermal, electronic, and other properties. As the number of commercial electronics and displays applications continues to grow, the breadth and specificity of requisite properties demand the innovation of materials with new and/or improved properties. Polymeric materials are increasingly finding use in such applications as a result of their widely-variable properties and processability advantages over more-conventional incumbent materials.

Polyarylene polymers represent one such class of materials. They can be made to exhibit an effective combination of good chemical resistance, high $T_g$, and mechanical toughness that are required in many electronics and displays applications. Further, polyarylene polymer molecular weight and solution concentration may be adjusted to enable precise and convenient deposition by spin-coating—a universally-important industrial processing method. The aromatic hydrocarbon structure of the cured film provides low dielectric constant, high thermal stability, and low moisture absorption. The synthetic flexibility afforded by heteroatom inclusion, copolymer formation, and the like makes available families of materials that can be prepared for highly-specific applications in-use.

Polyimides are another class of polymeric materials that have found wide-ranging uses in electronics and displays applications since they were first introduced (see, for example, U.S. Pat. No. 8,653,512 B2). These materials can exhibit low dielectric constants, low moisture absorption, high $T_g$, good thermal stability, low coefficient of thermal expansion (CTE), excellent chemical resistance, and flexible processability.

Given the importance of these two classes of polymeric materials, efforts have been made to produce hybrid polyarylene-polyimide polymers for use in electronics and displays applications. The polyarylenes are generally recognized for their contribution of favorably-low dielectric constants, while polyimides can contribute highly modular and tunable thermal and mechanical properties. The two classes of materials can be used individually or combined into a single, unbranched polymer chain that can exhibit the strengths of both polymer types with hybrid properties that are tunable to particular end-uses electronics and displays applications. Polyarylene-polyimide polymers are further known to exhibit spin- and slot-die coater compatibility, high coating uniformity, low defect and surface roughness, low outgassing, short cure time, and low stress-after-cure, and other useful properties. The coatings and films associated with these compositions can be prepared which exhibit a high degree of flexibility and toughness, high elongation, and thermal stability at the high temperatures associated with processing conditions typical in electronics and displays applications.

The polyarylene, polyimide, and hybrid polymers can exhibit optical properties that make them particularly well-suited to the technical challenges provided by optical elements and devices of increasing utility and complexity. Many such devices can exhibit significant losses in efficiency because of the way that light moves within and through their structural elements. Display devices like LEDs and OLEDs often suffer significantly-reduced efficiencies because light generated is lost via scattering and internal reflection. As generated light passes between elements or layers of different refractive indices, a significant percentage of it can be lost. Further, cross-talk between pixels in OLEDS can lead to efficiency losses that result from unwanted communication between red, green, and blue pixels. These display-device inefficiencies are all possibly addressable through more-precise management of the refractive indices, and the relative refractive indices, of their respective components. The introduction of a relatively-high-refractive index light-extraction layer between an OLED encapsulant layer and polarizer layer, for example, can greatly increase number of photons emitted from a top-display device. Further, the use of relatively low-refractive-index banks between pixels in the emissive layer of an OLED can significantly reduce cross-talk to generate improved efficiencies.

Similar considerations can apply to optical devices wherein the light in question is incident-versus-emitted. CMOS image sensors can suffer reduced efficiencies that result from scattering by a refractive-index mismatch between the external environment and the color filter surface. This can be matched via the introduction of a high-surface-area microlense on top of the color filter, and the scattered light can be recovered for detection. Further, and similar to the case for OLEDs, low-refractive-index spacers can be used between the red, green, and blue color filters to minimize pixel cross-talk in CMOS image sensors.

Judicious use of optical materials in other types of devices can similarly be used to drive efficiency improvements, although sometimes materials' refractive indices are manipulated to increase internal reflection. Core/clad waveguides, for example, operate most efficiently when transmitted light passes longitudinally through the guide. In practice, however, a portion of the transmitted light travels off-axis and escapes the guide. This situation can be remedied via the use of materials for the core (low refractive index) and cladding (high refractive index) that maximize the refractive index difference between the concentric layers to drive internal reflection and thereby reduce signal loss.

These, and other, optical uses continue to place ever-more-stringent optical requirements on device materials. Polyarylenes, polyimides, and hybrid polymers offer the potential to meet such demands. Such materials can find advantages in use not only because of their inherent processability, but specific optical properties can be tuned to meet the exacting parametric demands of increasingly-complicated optical devices. Because of this, there is an ongoing need for the development of such materials in this context. Not only will the current-device performance/efficiency be improved, but components with superior light management capabilities will facilitate the drive towards new devices with smaller optical elements for use in an expanding number of commercial applications.

DETAILED DESCRIPTION

Before explaining at least one embodiment of the present disclosure in detail, it is to be understood that the present disclosure is not limited in its application to the details of construction and the arrangement of the components or steps or methodologies set forth in the following description. The present disclosure is capable of other embodiments or of being practiced or carried out in various ways. Also, it is to be understood that the phraseology and terminology employed herein is for the purpose of description and should not be regarded as limiting.

Unless otherwise defined herein, technical terms used in connection with the present disclosure shall have the meanings that are commonly understood by those of ordinary skill in the art. Further, unless otherwise required by context, singular terms shall include pluralities and plural terms shall include the singular.

All patents, published patent applications, and non-patent publications mentioned in the specification are indicative of the level of skill of those skilled in the art to which the present disclosure pertains. All patents, published patent applications, and non-patent publications referenced in any portion of this application are herein expressly incorporated by reference in their entirety to the same extent as if each individual patent or publication was specifically and individually indicated to be incorporated by reference.

All of the articles and/or methods disclosed herein can be made and executed without undue experimentation in light of the present disclosure. While the articles and methods of the present disclosure have been described in terms of preferred embodiments, it will be apparent to those of ordinary skill in the art that variations may be applied to the articles and/or methods and in the steps or in the sequence of steps of the method(s) described herein without departing from the concept, spirit and scope of the present disclosure. All such similar substitutes and modifications apparent to those skilled in the art are deemed to be within the spirit, scope and concept of the present disclosure.

As utilized in accordance with the present disclosure, the following terms, unless otherwise indicated, shall be understood to have the following meanings.

The use of the word "a" or "an" when used in conjunction with the term "comprising" may mean "one," but it is also consistent with the meaning of "one or more," "at least one," and "one or more than one." The use of the term "or" is used to mean "and/or" unless explicitly indicated to refer to alternatives only if the alternatives are mutually exclusive, although the disclosure supports a definition that refers to only alternatives and "and/or." Throughout this application, the term "about" is used to indicate that a value includes the inherent variation of error for the quantifying device, the method(s) being employed to determine the value, or the variation that exists among the study subjects. For example, but not by way of limitation, when the term "about" is utilized, the designated value may vary by plus or minus twelve percent, or eleven percent, or ten percent, or nine percent, or eight percent, or seven percent, or six percent, or five percent, or four percent, or three percent, or two percent, or one percent. The use of the term "at least one" will be understood to include one as well as any quantity more than one, including but not limited to, 1, 2, 3, 4, 5, 10, 15, 20, 30, 40, 50, 100, etc. The term "at least one" may extend up to 100 or 1000 or more depending on the term to which it is attached. In addition, the quantities of 100/1000 are not to be considered limiting as lower or higher limits may also produce satisfactory results. In addition, the use of the term "at least one of X, Y, and Z" will be understood to include X alone, Y alone, and Z alone, as well as any combination of X, Y, and Z. The use of ordinal number terminology (i.e., "first", "second", "third", "fourth", etc.) is solely for the purpose of differentiating between two or more items and, unless otherwise stated, is not meant to imply any sequence or order or importance to one item over another or any order of addition.

As used herein, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. The terms "or combinations thereof" and "and/or combinations thereof" as used herein refer to all permutations and combinations of the listed items preceding the term. For example, "A, B, C, or combinations thereof" is intended to include at least one of: A, B, C, AB, AC, BC, or ABC and, if order is important in a particular context, also BA, CA, CB, CBA, BCA, ACB, BAC, or CAB. Continuing with this example, expressly included are combinations that contain repeats of one or more items or terms, such as BB, AAA, AAB, BBC, AAABCCCC, CBBAAA, CABABB, and so forth. The skilled artisan will understand that typically there is no limit on the number of items or terms in any combination, unless otherwise apparent from the context.

As used herein, the term "substantially" means that the subsequently described circumstance completely occurs or that the subsequently described circumstance occurs to a great extent or degree.

For purposes of the following detailed description, other than in any operating examples, or where otherwise indicated, numbers that express, for example, quantities of ingredients used in the specification and claims are to be understood as being modified in all instances by the term "about." The numerical parameters set forth in the specification and attached claims are approximations that may vary depending upon the desired properties to be obtained in carrying out the invention.

The term "alicyclic" refers to a cyclic group that is not aromatic. The group can be saturated or unsaturated, but it does not exhibit aromatic character.

The term "alkyl" refers to a saturated linear or branched hydrocarbon group of 1 to 50 carbons. It further includes both substituted and unsubstituted hydrocarbon groups. The term is further intended to include heteroalkyl groups.

The term "aprotic" refers to a class of solvents that lack an acidic hydrogen atom and are therefore incapable of acting as hydrogen donors. Common aprotic solvents include alkanes, carbon tetrachloride ($CCl_4$), benzene, dimethyl formamide (DMF), N-methyl-2-pyrrolidone (NMP), dimethylacetamide (DMAc), propylene glycol methyl ether acetate (PGMEA), anisole, cyclohexanone, benzyl benzoate, and many others.

The term "aromatic compound" refers to an organic compound comprising at least one unsaturated cyclic group having 4n+2 delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like.

The term "aryl" or "aryl group" refers to a moiety formed by removal of one or more hydrogen ("H") or deuterium ("D") from an aromatic compound. The aryl group may be a single ring (monocyclic) or have multiple rings (bicyclic, or more) fused together or linked covalently. A "carbocyclic aryl" has only carbon atoms in the aromatic ring(s). A "heteroaryl" has one or more heteroatoms in at least one aromatic ring.

The term "alkoxy" refers to the group —OR, where R is alkyl.

The term "aryloxy" refers to the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxy, siloxane, thioalkoxy, —S(O)$_2$—, —C(=O)—N(R')(R"), (R')(R")N-alkyl, (R')(R")N-alkoxyalkyl, (R')(R") N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

The term "amine" refers to a compound that contains a basic nitrogen atom with a lone pair. The term "amino" refers to the functional group —NH$_2$, —NHR, or —NR$_2$, where R is the same or different at each occurrence and can be an alkyl group or an aryl group. The term "diamine" refers to a compound that contains two basic nitrogen atoms with associated lone pairs. The term "aromatic diamine" refers to an aromatic compound having two amino groups.

The term "aromatic diamine residue" refers to the moiety bonded to the two amino groups in an aromatic diamine. This is further illustrated below.

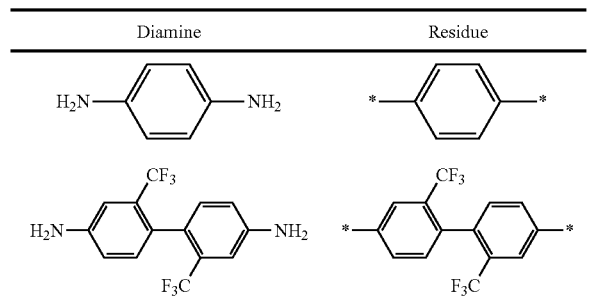

The term "coating" refers to a covering that is applied to the surface of an object that is usually referred to as the "substrate." Coatings may have various thicknesses and other properties, depending on the end-use appropriate for a given situation. In some non-limiting embodiments; the coating/substrate combination is used as a single unit, while in some embodiments, the coating is removed from the substrate for stand-alone use. In some non-limiting embodiments, the thus-removed coating is referred to as a film, a thin film, an optical thin film, or the like.

The term "crosslinker" or "cross-linking reagent" refers to a molecule that contains two or more reactive ends capable of chemically attaching to specific functional groups on molecules or polymers. The crosslinked molecules or polymers are chemically joined together by one or more covalent bonds.

The term "curing" refers to a process during which a chemical reaction or physical action takes place; resulting in a harder, tougher, or more stable linkage or substance. In polymer chemistry, "curing" specifically refers to the toughening or hardening of a polymer via cross-linking of polymer chains. Curing processes may be brought about by electron beams, heat, and/or chemical additives.

The term "linear coefficient of thermal expansion (CTE or α)" refers to the parameter that defines the amount which a material expands or contracts as a function of temperature. It is expressed as the change in length per degree Celsius and is generally expressed in units of μm/m/° C. or ppm/° C.

$$\alpha = (\Delta L/L0)/\Delta T$$

CTE values may be measured via known methods during the first or second heating scan. The understanding of the relative expansion/contraction characteristics of materials can be an important consideration in the fabrication and/or reliability of electronic and display devices.

The term "electroactive" as it refers to a layer or a material, refers to a layer or material which electronically facilitates the operation of a device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation.

The term "fused," when applied to aromatic or alicyclic rings refers to an aromatic or alicyclic species that contains two or more joined rings that may share a single atom, two adjacent atoms, or 3 or more atoms.

The term "glass transition temperature (or T$_g$)" refers to the temperature at which a reversible change occurs in an amorphous polymer or in amorphous regions of a semi-crystalline polymer where the material changes suddenly from a hard, glassy, or brittle state to one that is flexible or elastomeric. Microscopically, the glass transition occurs when normally-coiled, motionless polymer chains become free to rotate and can move past each other. T$_g$'s may be measured using differential scanning calorimetry (DSC), thermo-mechanical analysis (TMA), dynamic-mechanical analysis (DMA), or other methods.

The term "haloalkyl" is refers to an alkyl group having one or more hydrogen atoms replaced by a halogen atom.

The term "haloalkoxy" refers to an alkoxy group having one or more hydrogen atoms replaced by a halogen atom.

The prefix "hetero" refers to a situation where one or more carbon atoms have been replaced with a different atom. In some embodiments, the heteroatom is O, N, S, or combinations thereof.

The term "high-boiling" refers to a boiling point greater than 130° C.

The term "imide" refers to a functional group containing two acyl groups bound to a central nitrogen, i.e., RCO—NR'—COR. The term "bis-imide" refers to the presence of two identical, but separated, imide groups in a single molecule, polymer, or other species.

The term "matrix" refers to a foundation on which one or more layers is deposited in the formation of, for example, an electronic device. Non-limiting examples include glass, silicon, and others.

The term "monomer" refers to a small molecule that chemically bonds during polymerization to one or more monomers of the same or different kind to form a polymer.

The term "nonpolar" refers to a molecule, solvent, or other species in which the distribution of electrons between covalently-bonded atoms is even and there is thus no net electrical charge across them. In some embodiments; non-polar molecules, solvents, or other species are formed when constituent atoms have the same or similar electronegativities.

The term "optical thin film" refers to a polymeric film whose optical properties make it well-suited to provide specific function in optical devices such as those disclosed herein. Optical thin films may be prepared by any number of methods that are well known to those skilled in the art.

The term "organic electronic device" or sometimes "electronic device" refers to a device including one or more organic semiconductor layers or materials.

The term "polar" refers to a molecule, solvent, or other species in which the distribution of electrons between covalently-bonded atoms is not even. Such species therefore exhibit a large dipole moment which may result from bonds between atoms characterized by significantly-different electronegativities.

The term "polyimide" refers to condensation polymers resulting from the reaction of one or more bifunctional carboxylic acid components with one or more primary diamines or diisocyanates. Polyimides contain the imide structure —CO—NR—CO— as a linear or heterocyclic unit along the main chain of the polymer backbone.

The term "polymer" refers to a large molecule comprising one or more types of monomer residues (repeating units) connected by covalent chemical bonds. By this definition, a polymer encompasses compounds wherein the number of monomer units may range from very few, which more commonly may be called as oligomers, to very many. Non-limiting examples of polymers include homopolymers and non-homopolymers such as copolymers, terpolymers, tetrapolymers and the higher analogues.

The term "polyarylene" refers to a class of polymers that contain benzenoid aromatic components directly joined to one another by carbon-carbon bonds along the main chain of the polymer backbone.

The term "protic" refers to a class of solvents that contain an acidic hydrogen atom and are therefore capable of acting as hydrogen donors. Common protic solvents include formic acid, n-butanol, isopropanol, ethanol, methanol, acetic acid, water, propylene glycol methyl ether (PGME), propylene glycol methyl ether acetate (PGMEA), and others. Protic solvents can be used individually or in various combinations.

The term "refractive index" or "index of refraction" is a measure of the bending of a ray of light when it passes from one medium into another. If i is the angle of incidence of a ray in a vacuum (angle between the incoming ray and the perpendicular to the surface of a medium, called the normal) and r is the angle of refraction (angle between the ray in the medium and the normal), the refractive index n is defined as the ratio of the sine of the angle of incidence to the sine of the angle of refraction; i.e., n=sin i/sin r. Refractive index is also equal to the velocity of light c of a given wavelength in empty space divided by its velocity v in a substance, or n=c/v.

The term "satisfactory," when regarding a materials property or characteristic, is intended to mean that the property or characteristic fulfills all requirements/demands for the material in-use.

The term "shock test" refers to a method to assess polymer solubility wherein polymers are formulated in an appropriate solvent system in a specified concentration, optionally filtered, diluted, and subject to a test solvent system of interest. The polymer/solvent systems are rolled to mix, and solubility ratings are assessed by visual inspection for extent of mixing and amount of precipitation. In some embodiments, an appropriate solubility rating scale is that which is disclosed in detail herein.

The term "solubility" refers to the maximum amount of solute that can be dissolved in a solvent at a given temperature. In some embodiments, solubility may be measured or assessed by any number of qualitative or quantitative methods.

The term "substrate" refers to a base material that can be either rigid or flexible and may include one or more layers of one or more materials, which can include, but are not limited to, glass, polymer, metal or ceramic materials or combinations thereof. The substrate may or may not include electronic components, circuits, or conductive members.

The term "tetracarboxylic acid component" refers to any one or more of the following: a tetracarboxylic acid, a tetracarboxylic acid monoanhydride, a tetracarboxylic acid dianhydride, a tetracarboxylic acid monoester, and a tetracarboxylic acid diester.

The term "tetracarboxylic acid component residue" refers to the moiety bonded to the four carboxy groups in a tetracarboxylic acid component. This is further illustrated below.

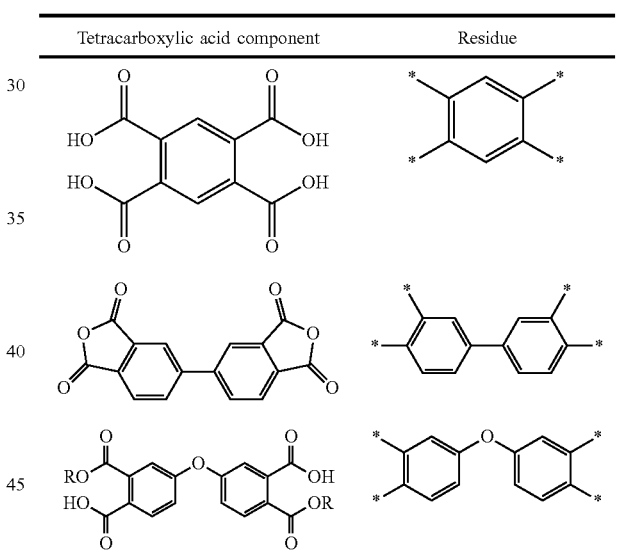

| Tetracarboxylic acid component | Residue |
| --- | --- |

The term "thermal acid generator" refers to a compound or compounds that, when heated, are capable of producing a strong acid or acids having a pKa of 2.0 or less. In one non-limiting embodiment, the thermal acid generator comprises a salt wherein a volatile base (e.g., pyridine) buffers a superacid (e.g., a sulfonate), and the mixture is heated above the heat of decomposition of the salt and the boiling point of the buffering base to remove the buffer and yield the strong acid. In another non-limiting embodiment, a thermal acid generator comprises a thermally-unstable buffer that breaks down upon heating to produce a strong acid. The use of thermal acid generators in electronics and displays applications described is described, for example, in U.S. 2014-0120469 A1. A variety of thermal acid generators are commercially available.

In a structure where a substituent bond passes through one or more rings as shown below,

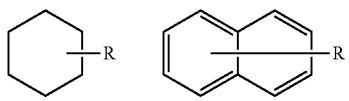

it is meant that the substituent R may be bonded at any available position on the one or more rings.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). Exemplary adjacent R groups are shown below:

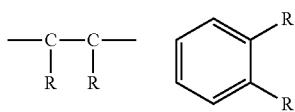

All percentages, ratios, and proportions used herein are based on weight unless otherwise specified.

The present disclosure is directed to a coating comprising a polymeric layer, wherein the polymeric layer comprises a reaction product of a first monomer comprising two or more aromatic acetylene groups and a second monomer comprising two or more cyclopentadienone groups, or a cured product of the reaction product. The present disclosure is further directed to a coating comprising a polymeric layer, wherein the polymeric layer comprises a reaction product of a first monomer comprising two or more aromatic acetylene groups, a second monomer comprising two or more cyclopentadienone groups, and a crosslinker; or a cured product of the reaction product.

In one non-limiting embodiment, the first monomer comprising two or more aromatic acetylene groups of the present disclosure can be represented by Formula 1a:

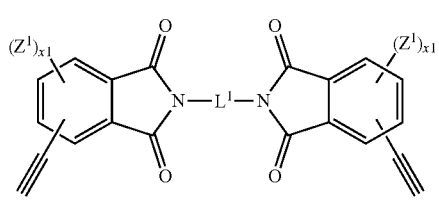

Formula 1a where $L^1$ is a divalent linking group substituted with $(Z^2)_y$; $Z^1$ and $Z^2$ are the same or different at each occurrence and are polar groups; and x1 and y are the same or different and are integers from 0 to 4.

In one non-limiting embodiment; $L^1$ is a divalent aromatic linking group that can be selected from the group consisting of hydrocarbon aryl groups, heteroaryl groups, and substituted derivatives thereof. In another non-limiting embodiment; $L^1$ is a divalent linking group that can be an unsubstituted hydrocarbon aryl or a hydrocarbon aryl having 6-30 ring carbons or a hydrocarbon aryl having 6-18 ring carbons. In another non-limiting embodiment; $L^1$ is selected from the group consisting of phenyl, biphenyl, terphenyl, naphthyl and substituted derivatives thereof.

In another non-limiting embodiment; $L^1$ is selected from the group consisting of heteroaryl, where the heteroaryl has at least one ring atom which is selected from the group consisting of O, N, and S. In one non-limiting embodiment; $L^1$ is an O-heteroaryl having at least one ring atom that is O. In another non-limiting embodiment; the O-heteroaryl is derived from a compound selected from the group consisting of furan, benzofuran, isobenzofuran, dibenzofuran, and substituted derivatives thereof. In one non-limiting embodiment; $L^1$ is an S-heteroaryl having at least one ring atom which is S. In another non-limiting embodiment; the S-heteroaryl is derived from a compound selected from the group consisting of thiophene, benzothiophene, isobenzothiophene, dibenzothiophene, and substituted derivatives thereof.

In another non-limiting embodiment of Formula 1a, $L^1$ has Formula 1aa:

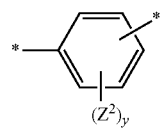

Formula 1aa where $Z^2$ and y are as defined elsewhere herein; and * denotes the points of attachment to the imide nitrogens of Formula 1a.

In another non-limiting embodiment of Formula 1a, $L^1$ has Formula 1bb:

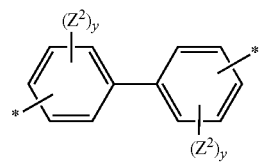

Formula 1bb where $Z^2$ and y are as defined elsewhere herein; and * denotes the points of attachment to the imide nitrogens of Formula 1a.

In another non-limiting embodiment of Formula 1a, $L^1$ has Formula 1cc or formula 1dd:

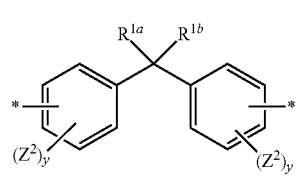

Formula 1cc

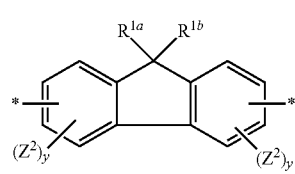

Formula 1dd where $R^{1a}$, and $R^{1b}$ are the same or different and can be selected from the group consisting of H, halogen, $C_{1-30}$ alkyl, $C_{1-C30}$ heteroalkyl, $C_{2-30}$ alkenyl, $C_{7-30}$ aralkyl, $C_{6-30}$ aryl, and $C_{4-30}$ heteroaryl; and $Z^2$, y, and * are as defined elsewhere herein.

In one non-limiting embodiment of Formula 1cc and Formula 1dd; $R^{1a}$ and $R^{1b}$ are F or $CF_3$.

In another non-limiting embodiment; $L^1$ is an alicyclic ring selected from the group consisting of cyclopropane, cyclobutane, cyclopentane, cyclohexane, cycloheptane, cyclooctane, bicycloundecane, decalin, housane, and the like and similar species.

In another non-limiting embodiment of Formula 1a; $L^1$ can be selected from the group consisting of the following species:

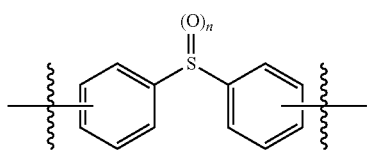

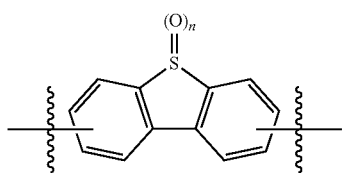

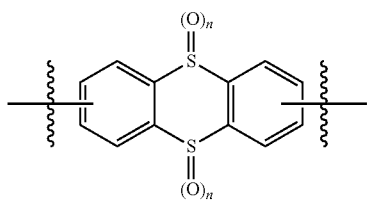

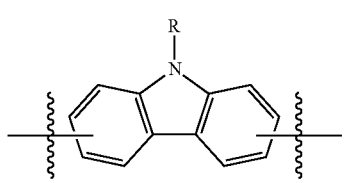

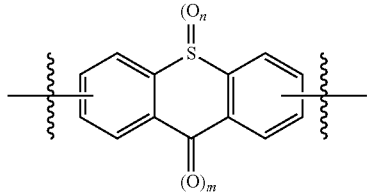

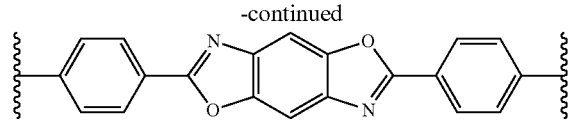

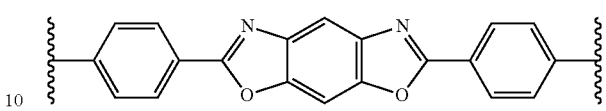

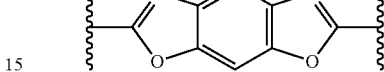

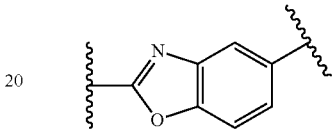

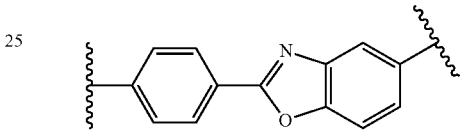

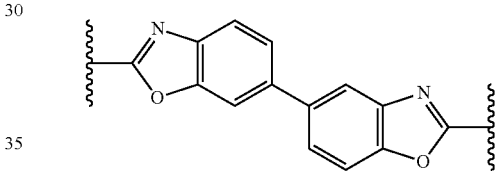

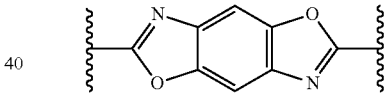

where R is selected from the group consisting of H, halogen, $C_{1-30}$ alkyl, $C_{1-C30}$ heteroalkyl, $C_{2-30}$ alkenyl, $C_{7-30}$ aralkyl, $C_{6-30}$ aryl, and $C_{4-30}$ heteroaryl; n is the same or different at each occurrence and is 0, 1, or 2; and m is 0 or 1.

In another non-limiting embodiment of Formula 1a; Formula 1a is given by Formula 1a':

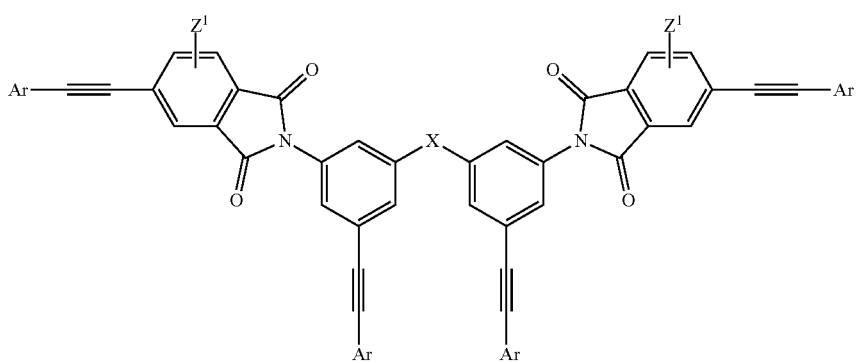

Formula 1a' where Ar groups are the same or different at each occurrence and are selected from the group consisting of $C_6$-$C_{30}$ aryl groups; $Z^1$ is the same or different at each occurrence and is a polar group; X is selected from the group consisting of S, O, SO, $SO_2$, and NR; and R is selected from the group consisting of H, halogen, $C_{1-30}$ alkyl, $C_{1-C30}$ heteroalkyl, $C_{2-30}$ alkenyl, $C_{7-30}$ aralkyl, $C_{6-30}$ aryl, and $C_{4-30}$ heteroaryl.

In some non-limiting embodiments of Formula 1a'; Ar groups are the same at each occurrence or different at each occurrence or selected from the group consisting of $C_5$-$C_{30}$ heteroaryl groups. In some non-limiting embodiments of Formula 1a'; Ar groups are the same or different at each occurrence and are selected from the group consisting of $C_6$-Cis aryl groups. In some non-limiting embodiments of Formula 1a'; Ar groups are the same or different at each occurrence and are selected from the group consisting of benzyl, napththyl, phenanthryl, and terphenyl. In some non-limiting embodiments of Formula 1a; X is S or O or SO or $SO_2$ or NR. In some non-limiting embodiments of Formula 1a; R is H or halogen or $C_{1-30}$ alkyl or $C_{1-30}$ heteroalkyl or $C_{2-30}$ alkenyl or $C_{7-30}$ aralkyl or $C_{6-30}$ aryl or $C_{4-30}$ heteroaryl.

In some non-limiting embodiments of Formula 1a or Formula 1a'; polar groups $Z^1$ and $Z^2$ are the same at each occurrence. In other non-limiting embodiments of Formula 1a or Formula 1a'; polar groups $Z^1$ and $Z^2$ are different at each occurrence. In some non-limiting embodiments of Formula 1a or Formula 1a'; polar groups $Z^1$ and $Z^2$ can be selected from the group consisting of OH, $CO_2H$, $CO_2R$, OR, $CX_3$, F, Cl, Br, SH, $CONH_2$, CONHR, $CONR_2$, and SR; where R is as disclosed elsewhere herein and X is a halogen.

In other non-limiting embodiment of Formula 1a or Formula 1a'; polar groups $Z^1$ and $Z^2$ are selected from the group consisting of $NR_2$,

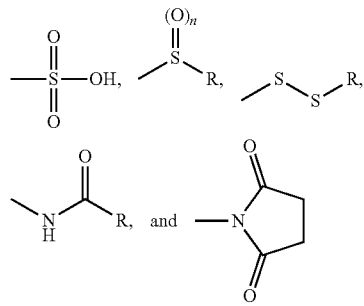

where R is as disclosed elsewhere herein and n=1 or n=2.

In some non-limiting embodiments of Formula 1a; x1=0 or x1=1 or x1=2 or x1=3; y=0 or y=1 or y=2 or y=3 or y=4.

Any of the above embodiments of Formula 1a and Formula 1a' can be combined with one or more of the other embodiments, so long as they are not mutually exclusive. For example, the embodiment of Formula 1a in which $L^1$ is a hydrocarbon aryl group can be combined with the embodiment of Formula 1a in which $Z^1$ is OH. The same is true for other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula 1a are:

Compound 1

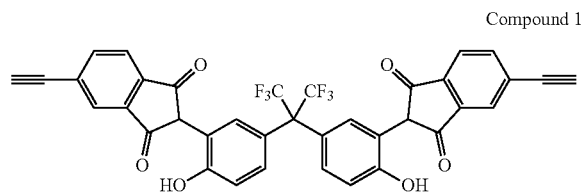

Compound 2

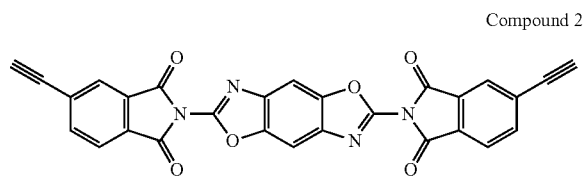

Compound 3

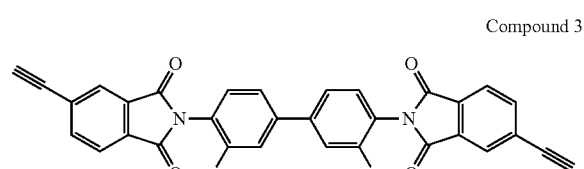

Compound 4

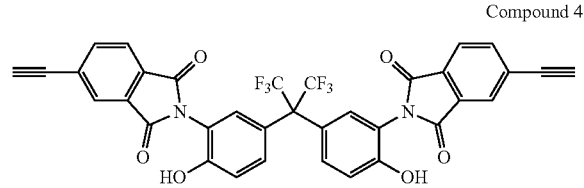

Compound 5

Compound 6

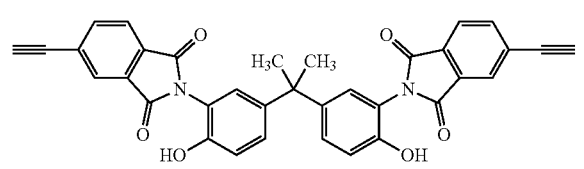

Compound 7

Compound 8

-continued

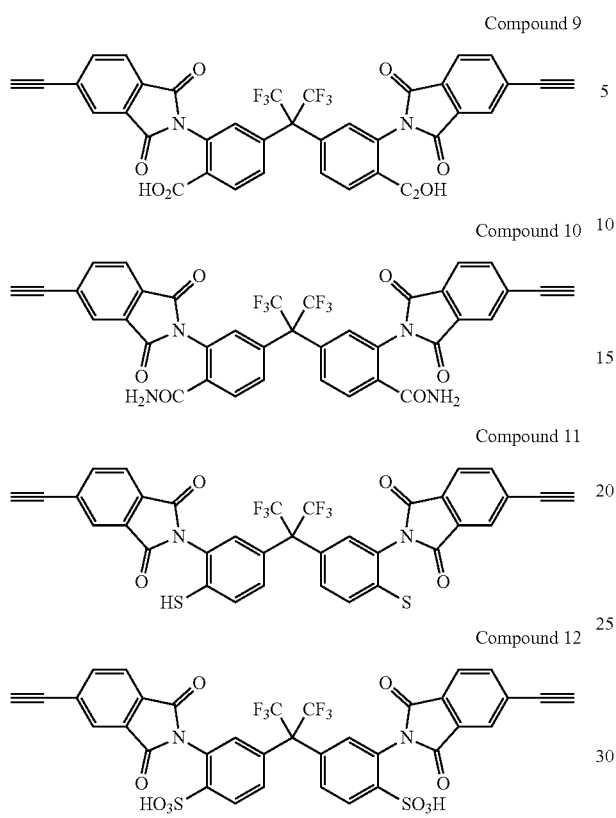

Compound 9

Compound 10

Compound 11

Compound 12

In one non-limiting embodiment, the first monomer comprising two or more aromatic acetylene groups of the present disclosure can be represented by Formula 1b:

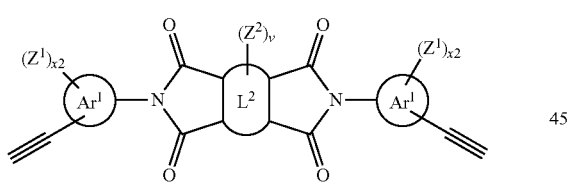

Formula 1b where $L^2$ is a fused aromatic or alicyclic ring; $Z^1$ and $Z^2$ are polar groups; $Ar^1$ is the same or different at each occurrence and is a $C_6$-$C_{30}$ aryl group; x2 is an integer from 0 to 4; v is an integer from 0 to 2, provided that v is 0 when $L^2$ is an alicyclic ring.

In one non-limiting embodiment of Formula 1b, $L^2$ is a fused aromatic ring selected from the group consisting of benzene, naphthalene, phenanthrene, phenalene, tetracene, chrysene, triphenylene, pyrene, pentacene, and the like and including species with more fused rings. In another non-limiting embodiment, $L^2$ is a phenyl group. In another non-limiting embodiment of Formula 1b, $L^2$ is a naphthyl group. In another non-limiting embodiment of Formula 1b, $L^2$ is a fused aromatic ring structure containing one or more heteroatoms. In another non-limiting embodiment of Formula 1b; $L^2$ can be selected from the group consisting of the following species:

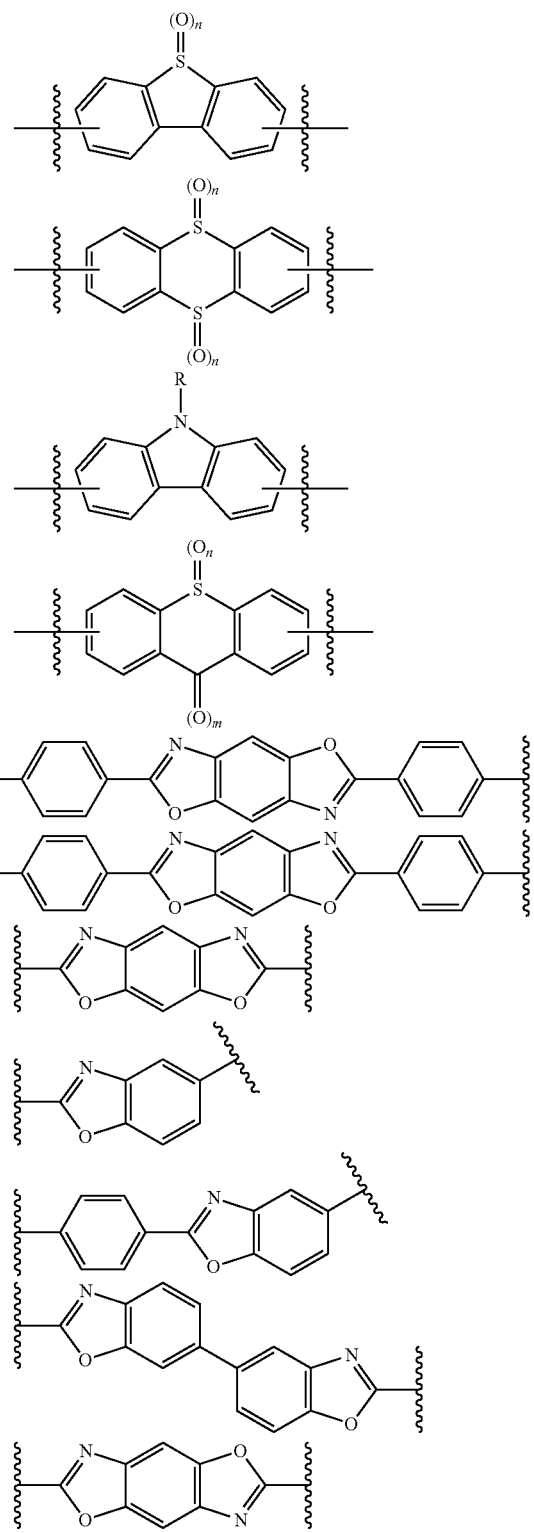

where R is selected from the group consisting of H, halogen, $C_{1-30}$ alkyl, $C_{1-C30}$ heteroalkyl, $C_{2-30}$ alkenyl, $C_{7-30}$ aralkyl, $C_{6-30}$ aryl, and $C_{4-30}$ heteroaryl; n is the same or different at each occurrence and is 0, 1, or 2; and m is 0 or 1.

In another non-limiting embodiment of Formula 1b, $L^2$ is an alicyclic ring. In another non-limiting embodiment of Formula 1b, $L^2$ is an alicyclic ring selected from the group consisting of cyclopropane, cyclobutane, cyclopentane, cyclohexane, cycloheptane, cyclooctane, bicycloundecane, decalin, housane, and the like and similar species. In another non-limiting embodiment of Formula 1b, $L^2$ is selected from the group consisting of cyclobutane, cyclopentane, and cyclohexane. In another non-limiting embodiment of Formula 1b, $L^2$ is selected from the group consisting of a 4- to 6-membered alicyclic ring, a benzene ring, and a naphthalene ring. In another non-limiting embodiment of Formula 1b, $L^2$ contains one or more heteroatoms. In another non-limiting embodiment of Formula 1b, $L^2$ contains heteroatoms selected from the group consisting of N, O and S.

In another non-limiting embodiment of Formula 1b, $L^2$ is:

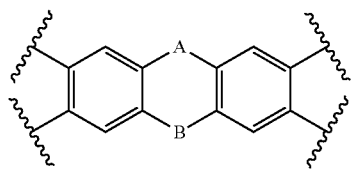

where A and B are the same or different at each occurrence and are selected from the group consisting of $CH_2$, $CF_2$, $C(CH_3)_2$, $C(CH_3)(CF_3)$, $C(CF_3)_2$, $C(O)$, O, S, SO, $SO_2$, and fluorenyl.

In another non-limiting embodiment of Formula 1b; Formula 1b is given by Formula 1b':

Formula 1b'

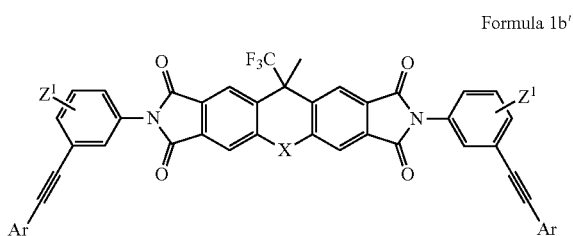

where Ar groups are the same or different at each occurrence and are selected from the group consisting of $C_6$-$C_{30}$ aryl groups; $Z^1$ is a polar group; X is selected from the group consisting of S, O, SO, $SO_2$, and NR; and R is selected from the group consisting of H, halogen, $C_{1-30}$ alkyl, $C_{1-C30}$ heteroalkyl, $C_{2-30}$ alkenyl, $C_{7-30}$ aralkyl, $C_{6-30}$ aryl, and $C_{4-30}$ heteroaryl.

Non-limiting, specific embodiments for Ar, $Z^1$, and X in Formula 1b' are the same as those identified in the context of Formula 1a' disclosed herein.

In one non-limiting embodiment of Formula 1b, $Ar^1$ is the same or different at each occurrence and is selected from the group consisting of $C_6$-$C_{30}$ aryl groups. In another non-limiting embodiment of Formula 1b, $Ar^1$ is the same or different at each occurrence and is selected from the group consisting of benzyl, naphthyl, phenanthryl, triphenyl, and the like and including species with more fused rings. In another non-limiting embodiment of Formula 1b, $Ar^1$ is the same or different at each occurrence and is selected from the group consisting of $C_5$-$C_{30}$ heteroaryl groups. In another non-limiting embodiment of Formula 1b, $Ar^1$ is the same or different at each occurrence and contains N, O, or S as a heteroatom.

In some non-limiting embodiments of Formula 1b'; X is S or O or SO or $SO_2$ or NR. In some non-limiting embodiments of Formula 1b'; R is H or halogen or $C_{1-30}$ alkyl or $C_{1-30}$ heteroalkyl or $C_{2-30}$ alkenyl or $C_{7-30}$ aralkyl or $C_{6-30}$ aryl or $C_{4-30}$ heteroaryl.

In some non-limiting embodiments of Formula 1b or Formula 1b'; polar groups $Z^1$ and $Z^2$ are the same at each occurrence. In other non-limiting embodiments of Formula 1b or Formula 1b'; polar groups $Z^1$ and $Z^2$ are different at each occurrence. In some non-limiting embodiments of Formula 1b or Formula 1b'; polar groups $Z^1$ and $Z^2$ can be selected from the group consisting of OH, $CO_2H$, $CO_2R$, OR, $CX_3$, F, Cl, Br, SH, $CONH_2$, CONHR, $CONR_2$, and SR; where R is as disclosed elsewhere herein and X is a halogen.

In other non-limiting embodiment of Formula 1b or Formula 1b'; polar groups $Z^1$ and $Z^2$ are selected from the group consisting of $NR_2$,

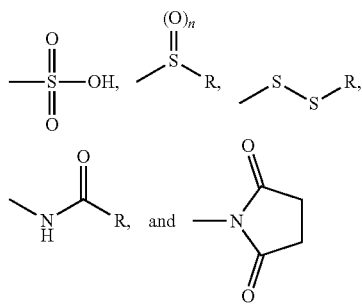

where R is as disclosed elsewhere herein and n=1 or n=2.

In some non-limiting embodiments of Formula 1b; x2=0 or x2=1 or x2=2 or x2=3 or x2=4; v=0 when $L^2$ is a fused aromatic ring or v=0 when $L^2$ is a fused alicyclic ring or v=1 or v=2.

Any of the above embodiments of Formula 1b or Formula 1b' can be combined with one or more of the other embodiments, so long as they are not mutually exclusive. For example, the embodiment of Formula 1b in which $L^2$ is a fused aromatic ring can be combined with the embodiment of Formula 1b in which Z' is $CF_3$. The same is true for other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula 1b are:

Compound 13

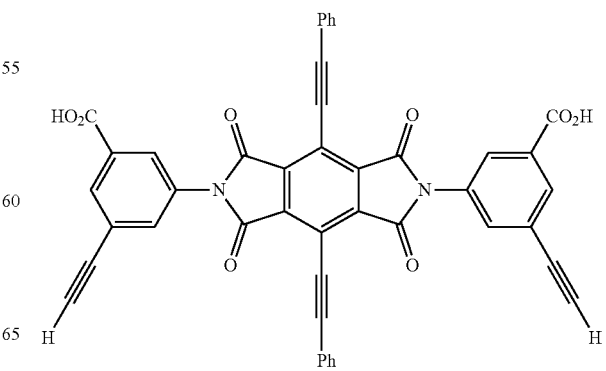

-continued

Compound 14

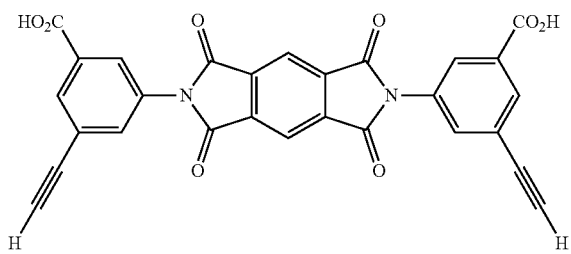

Compound 15

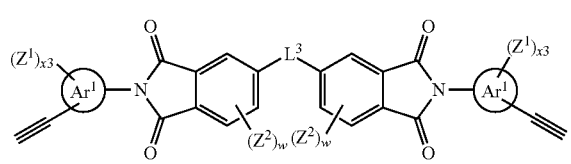

In one non-limiting embodiment, the first monomer comprising two or more aromatic acetylene groups of the present disclosure can be represented by Formula 1c:

Formula 1c

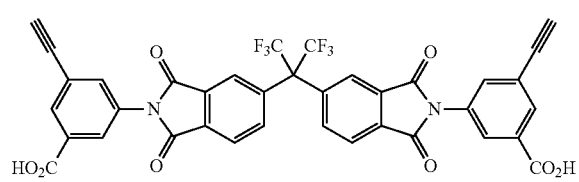

where $L^3$ is a divalent linking group; all embodiments of $Ar^1$, $Z^1$, and $Z^2$ disclosed herein for Formula 1a and Formula 1b apply equally well to $Ar^1$, $Z^1$, and $Z^2$ in Formula 1c; x3 is an integer from 0 to 4; and w is an integer from 0 to 3.

In one non-limiting embodiment of Formula 1c; $L^3$ is selected from the group consisting of a single covalent bond, an alkyl group, O, S, C(O), C(S), S(O), $SO_2$, $CF_2$, and $C(CF_3)_2$.

In some non-limiting embodiments of Formula 1c; x3=0 or x3=1 or x3=2 or x3=3 or x3=4; w=0 or w=1 or w=2 or w=3.

Any of the above embodiments of Formula 1c can be combined with one or more of the other embodiments, so long as they are not mutually exclusive. For example, the embodiment in which $L^3$ is —$C(CF_3)_2$ can be combined with the embodiment in which x3 is 2. The same is true for other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula 1c are:

Compound 16

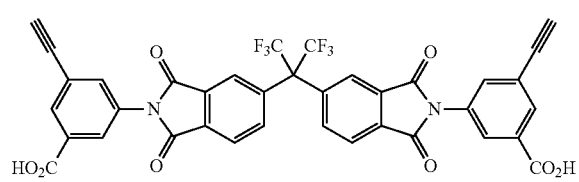

Compound 17

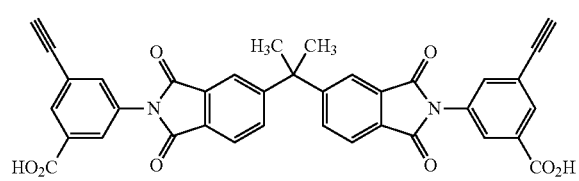

Compound 18

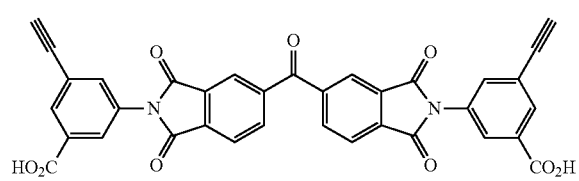

Compound 19

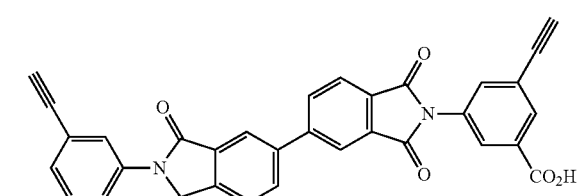

Compound 20

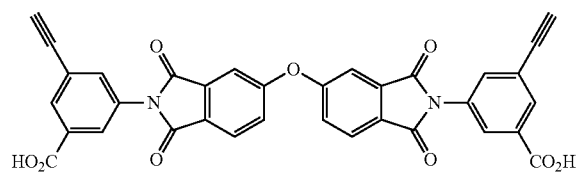

Compound 21

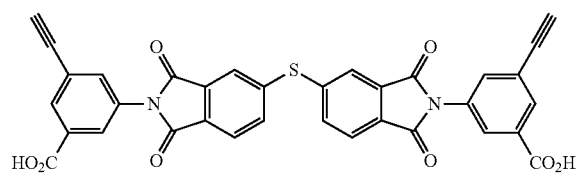

Compound 22

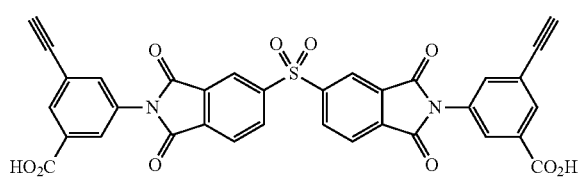

Compound 23

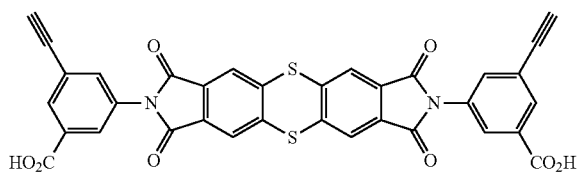

Compound 24

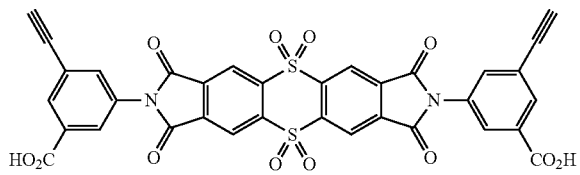

In one non-limiting embodiment, the first monomer comprising two or more aromatic acetylene groups of the present disclosure can be represented by Formula 2a:

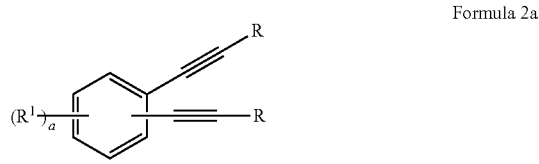

Formula 2a where R is the same or different at each occurrence and is selected from the group consisting of H, —C(=O)OR$^2$, substituted or unsubstituted C$_{6-20}$ aryl, and substituted or unsubstituted C$_{4-20}$ heteroaryl; R$^1$ is the same or different at each occurrence and is selected from the group consisting of H, F, C$_1$, Br, I, substituted or unsubstituted C$_{1-10}$ alkyl, substituted or unsubstituted C$_{6-20}$ aryl, C$_{4-20}$ heteroaryl, —C(=O)OR$^2$, —C(=O)NHR$^3$, —O—C(=O)R$^3$, —NHC(=O)R$^3$, —SR$^3$, —S(=O)R$^3$, —S(=O)$_2$R$^3$, —S(=O)$_2$—OR$^3$, and S(=O)$_2$—NHR$^3$, —PH$_2$, —P(=O)R$_2$$^3$, —P(=O)(OR$^3$)$_2$; and a is an integer from 0 to 2.

In some non-limiting embodiments of Formula 2a, R is the same or different at each occurrence and is selected from the group consisting of H and substituted or unsubstituted C$_{6-20}$ aryl. In some non-limiting embodiments of Formula 2a, R is selected from the group consisting of H and substituted or unsubstituted C$_{6-12}$ aryl. In some non-limiting embodiments of Formula 2a, R is selected from the group consisting of H and phenyl.

In some non-limiting embodiments of Formula 2a, R$^1$ is the same or different at each occurrence and is selected from the group consisting of —OH, C$_{1-6}$ hydroxyalkyl, —C(=O)OR$^3$, —C(=O)N(R$^4$)$_2$, —O—C(=O)R$^5$, —NR$^4$C(=O)R$^6$, —N(R$^4$)$_3$$^+$An–, —NO$_2$; —S(=O)$_2$—OR$^7$, —O—S(=O)$_2$—R$^8$, —NR$^4$—S(=O)$^2$—R$^6$, and S(=O)$_2$—N(R$^4$)$_2$. In some non-limiting embodiments of Formula 2a, R$^3$ is the same or different at each occurrence and is selected from the group consisting of H, C$_{1-10}$ alkyl, C$_{1-10}$ hydroxyalkyl, C$_{1-10}$ aminoalkyl, C$_{6-30}$ aryl, and M. In some non-limiting embodiments of Formula 2a, R$^4$ is the same or different at each occurrence and is selected from the group consisting of H, C$_{6-30}$ aryl, and C$_{1-10}$ alkyl. In some non-limiting embodiments of Formula 2a, R$^5$ is the same or different at each occurrence and is selected from the group consisting of H, C$_{1-10}$ alkyl, C$_{1-10}$ hydroxyalkyl, C$_{6-30}$ aryl, —O(C$_{1-10}$ alkyl), —O(C$_{6-10}$ aryl) and —N(R$^4$)$_2$. In some non-limiting embodiments of Formula 2a, R$^6$ is the same or different at each occurrence and is selected from the group consisting of H, C$_{1-10}$ alkyl, C$_{1-10}$ hydroxyalkyl, C$_{6-30}$ aryl, —O(C$_{1-10}$ alkyl), —NH(C$_{1-10}$ alkyl), and —NR$_2$. In some non-limiting embodiments of Formula 2a, R$^7$ is the same or different at each occurrence and is selected from the group consisting of H, C$_{1-10}$ alkyl, C$_{6-30}$ aryl, and M. In some non-limiting embodiments of Formula 2a, R$^8$ is the same or different at each occurrence and is selected from the group consisting of C$_{6-30}$ aryl, C$_{1-10}$ alkyl, and halo C$_{1-10}$ alkyl. In some non-limiting embodiments of Formula 2a, M is the same or different at each occurrence and is selected from the group consisting of an alkali metal ion, an alkaline earth metal ion, and an ammonium ion. In some non-limiting embodiments of Formula 2a, An– is the same or different at each occurrence and is selected from the group consisting of an anion chosen from a halide and a C$_{1-20}$ carboxylate.

In some non-limiting embodiments of Formula 2a, R$^1$ is the same or different at each occurrence and is selected from the group consisting of —OH, C$_{1-4}$ hydroxyalkyl, —C(=O)OR$^3$, —C(=O)N(R$^4$)$_2$, —O—C(=O)R$^5$, —S(=O)$_2$—OR$^6$, and S(=O)$_2$—N(R$^4$)$_2$. In some non-limiting embodiments of Formula 2a, R$^1$ is the same or different at each occurrence and is selected from the group consisting of —OH, C$_{1-4}$ hydroxyalkyl, —C(=O)OR$^3$, and —C(=O)N(R$^4$)$_2$. In some non-limiting embodiments of Formula 2a, R$^1$ is the same or different at each occurrence and is selected from the group consisting of —OH and —C(=O)OR$^3$. In some non-limiting embodiments of Formula 2a, R$^3$ is the same or different at each occurrence and is selected from the group consisting of H, C$_{1-6}$ alkyl, C$_{1-6}$ hydroxyalkyl, C$_{1-6}$ aminoalkyl, C$_{6-30}$ aryl, and M. In some non-limiting embodiments of Formula 2a, R$^3$ is the same or different at each occurrence and is selected from the group consisting of H, C$_{1-4}$ alkyl, C$_{1-6}$ hydroxyalkyl, and M. In some non-limiting embodiments of Formula 2a, R$^3$ is the same or different at each occurrence and is selected from the group consisting of H and M. In some non-limiting embodiments of Formula 2a, R$^4$ is the same or different at each occurrence and is selected from the group consisting of H, C$_{6-30}$ aryl, and C$_{1-6}$ alkyl. In some non-limiting embodiments of Formula 2a, R$^4$ is the same or different at each occurrence and is selected from the group consisting of H and C$_{1-4}$ alkyl. In some non-limiting embodiments of Formula 2a, R$^5$ is the same or different at each occurrence and is selected from the group consisting of C$_{1-6}$ alkyl, C$_{1-6}$ hydroxyalkyl, C$_{6-30}$ aryl, —O(C$_{1-10}$ alkyl), and —N(R$^4$)$_2$. In some non-limiting embodiments of Formula 2a, R$^5$ is the same or different at each occurrence and is selected from the group consisting of C$_{1-6}$ alkyl, C$_{1-6}$ hydroxyalkyl, C$_{6-20}$ aryl, —O(C$_{1-6}$ alkyl), and —N(R$^4$)$_2$. In some non-limiting embodiments of Formula 2a, R$^6$ is the same or different at each occurrence and is selected from the group consisting of H, C$_{1-10}$ alkyl, C$_{1-6}$ hydroxyalkyl, C$_{6-20}$ aryl, —O(C$_{1-10}$ alkyl), and —NR$_2$. In some non-limiting embodiments of Formula 2a, R$^6$ is the same or different at each occurrence and is selected from the group consisting of H, C$_{1-6}$ alkyl, —O(C$_{1-6}$ alkyl), and —NR$_2$. In some non-limiting embodiments of Formula 2a, R$^7$ is the same or different at each occurrence and is selected from the group consisting of H, C$_{1-6}$ alkyl, C$_{6-20}$ aryl, and M. In some non-limiting embodiments of Formula 2a, R$^7$ is the same or different at each occurrence and is selected from the group consisting of H, C$_{1-4}$ alkyl, and M. In some non-limiting embodiments of Formula 2a, R$^7$ is the same or different at each occurrence and is selected from the group consisting of H and M. In some non-limiting embodiments of Formula 2a, R$^8$ is the same or different at each occurrence and is selected from the group consisting of $C_{6-20}$ aryl, $C_{1-10}$ alkyl, and $C_{1-10}$ fluoroalkyl. In some non-limiting embodiments of Formula 2a, $R^8$ is the same or different at each occurrence and is selected from the group consisting of phenyl, tolyl, methyl, and trifluoromethyl.

Any suitable ammonium ion may be used for M, such as those of the formula $[NA_4]^+$ wherein each A is independently chosen from H, $C_{1-6}$ alkyl, $C_{7-10}$ aralkyl and $C_{6-8}$ aryl. Exemplary ammonium ions include, without limitation, ammonium, tetramethylammonium, tetraethyl-ammonium, tetrabenzylammonium, and tetraphenylammonium. Preferred alkali metal ions for M are lithium ions, sodium ions or potassium ions. Preferred alkaline earth ions for M are magnesium ions or calcium ions. In some non-limiting embodiments, M is chosen from lithium ions, sodium ions, potassium ions, magnesium ions, calcium ions and ammonium ions. In some non-limiting embodiments, M is chosen from lithium ions, sodium ions, potassium ions, and ammonium ions. In some non-limiting embodiments, M is chosen from lithium ions, sodium ions, potassium ions, and ammonium ions of the formula $[NA_4]^+$ wherein each A is independently chosen from H, $C_{1-6}$ alkyl, $C_{7-10}$ aralkyl and $C_{6-8}$ aryl. In some non-limiting embodiments, M is chosen from alkali metal ions and ammonium ions. In some non-limiting embodiments, An– is chosen from halide and $C_{1-10}$ carboxylate. In some non-limiting embodiments, An– is chosen from halide and $C_{1-6}$ carboxylate.

In some non-limiting embodiments of Formula 2a, a=0 to 2. In some non-limiting embodiments of Formula 2a, a=0. In some non-limiting embodiments of Formula 2a, a=1. In some non-limiting embodiments of Formula 2a, a=2.

In some non-limiting embodiments of Formula 2a, any two alkynyl moieties may have an ortho, meta or para relationship to each other. In some non-limiting embodiments of Formula 2a, any two alkynyl moieties may have a meta or para relationship to each other. In some non-limiting embodiments of Formula 2a, the alkynyl moieties in the monomers do not have an ortho relationship to each other. Suitable compounds of Formula 2a are generally commercially available or may be readily prepared by methods known in the art.

Some non-limiting examples of compounds having Formula 2a are:

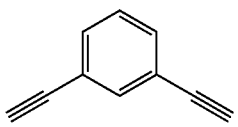

Compound 25

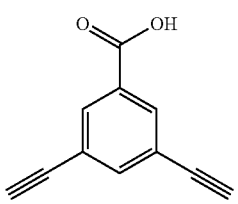

Compound 26

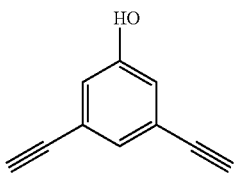

Compound 27

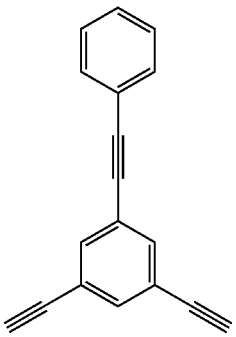

Compound 28

In one non-limiting embodiment, the first monomer comprising two or more aromatic acetylene groups of the present disclosure can be represented by Formula 2b:

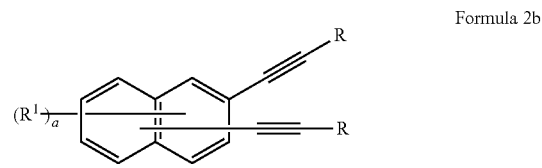

Formula 2b where R is the same or different at each occurrence and is selected from the group consisting of H, —C(=O)OR², substituted or unsubstituted $C_{6-20}$ aryl, and substituted or unsubstituted $C_{4-20}$ heteroaryl; $R^1$ is the same or different at each occurrence and is selected from the group consisting of H, F, $C_1$, Br, I, substituted or unsubstituted $C_{1-10}$ alkyl, substituted or unsubstituted $C_{6-20}$ aryl, $C_{4-20}$ heteroaryl, —C(=O)OR², —C(=O)NHR³, —O—C(=O)R³, —NHC(=O)R³, —SR³, —S(=O)R³, —S(=O)₂R³, —S(=O)₂—OR³, and S(=O)₂—NHR³, —PH₂, —P(=O)R₂³, —P(=O)(OR³)₂; $R^2$ is the same or different at each occurrence and is selected from the group consisting of H, substituted or unsubstituted $C_{1-10}$ alkyl, $C_{6-20}$ aryl, and $C_{4-20}$ heteroaryl; $R^3$ is the same or different at each occurrence and is selected from the group consisting of H and substituted or unsubstituted $C_{1-10}$ alkyl; and a is an integer from 0 to 3.

Non-limiting embodiments of R and $R^1$ disclosed herein for Formula 2a apply equally to Formula 2b. In some non-limiting embodiments of Formula 2b, a=0 to 3. In some non-limiting embodiments of Formula 2b, a=0. In some non-limiting embodiments of Formula 2b, a=1. In some non-limiting embodiments of Formula 2b, a=2. In some non-limiting embodiments of Formula 2b, a=3.

A non-limiting example of a compound having Formula 2b is:

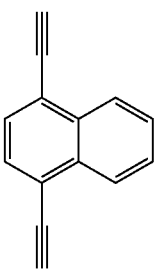

Compound 29

In one non-limiting embodiment, the first monomer comprising two or more aromatic acetylene groups of the present disclosure can be represented by Formula 2c:

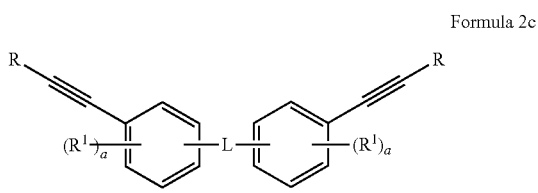

Formula 2c where R is the same or different at each occurrence and is selected from the group consisting of H, —C(=O)OR$^2$, substituted or unsubstituted C$_{6-20}$ aryl, and substituted or unsubstituted C$_{4-20}$ heteroaryl; R$^1$ is the same or different at each occurrence and is selected from the group consisting of H, F, Cl, Br, I, substituted or unsubstituted C$_{1-10}$ alkyl, substituted or unsubstituted C$_{6-20}$ aryl, C$_{4-20}$ heteroaryl, —C(=O)OR$^2$, —C(=O)NHR$^3$, —O—C(=O)R$^3$, —NHC(=O)R$^3$, —SR$^3$, —S(=O)R$^3$, —S(=O)$_2$R$^3$, —S(=O)$_2$—OR$^3$, and S(=O)$_2$—NHR$^3$, —PH$_2$, —P(=O)R$_2^3$, —P(=O)(OR$^3$)$_2$; R$^2$ is the same or different at each occurrence and is selected from the group consisting of H, substituted or unsubstituted C$_{1-10}$ alkyl, C$_{6-20}$ aryl, and C$_{4-20}$ heteroaryl; R$^3$ is the same or different at each occurrence and is selected from the group consisting of H and substituted or unsubstituted C$_{1-10}$ alkyl; L is a substituted or unsubstituted divalent aromatic linking group; and a is an integer from 0 to 2.

Non-limiting embodiments of R and R$^1$ disclosed herein for Formula 2a and Formula 2c apply equally to Formula 2b.

In one non-limiting embodiment; L is a divalent aromatic linking group that can be selected from the group consisting of hydrocarbon aryl groups, heteroaryl groups, and substituted derivatives thereof. In another non-limiting embodiment; L is a divalent linking group that can be an unsubstituted hydrocarbon aryl or a hydrocarbon aryl having 6-30 ring carbons or a hydrocarbon aryl having 6-18 ring carbons. In another non-limiting embodiment; L is selected from the group consisting of phenyl, biphenyl, terphenyl, naphthyl and substituted derivatives thereof.

In another non-limiting embodiment; L is selected from the group consisting of heteroaryl, where the heteroaryl has at least one ring atom which is selected from the group consisting of O, N, and S. In one non-limiting embodiment; L is an O-heteroaryl having at least one ring atom that is O. In another non-limiting embodiment; the O-heteroaryl is derived from a compound selected from the group consisting of furan, benzofuran, isobenzofuran, dibenzofuran, and substituted derivatives thereof. In one non-limiting embodiment; L is an S-heteroaryl having at least one ring atom which is S. In another non-limiting embodiment; the S-heteroaryl is derived from a compound selected from the group consisting of thiophene, benzothiophene, isobenzothiophene, dibenzothiophene, and substituted derivatives thereof.

In another non-limiting embodiment of Formula 1a, L has Formula 1aa:

Formula 1aa where Z$^2$ and y are as defined elsewhere herein; and * denotes the points of attachment to the imide nitrogens of Formula 1a.

In another non-limiting embodiment of Formula 1a, L has Formula 1bb:

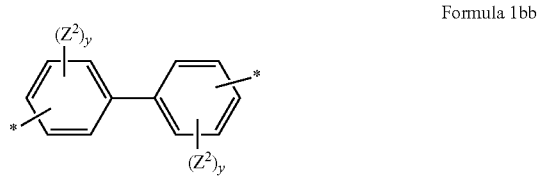

Formula 1bb where Z$^2$ and y are as defined elsewhere herein; and * denotes the points of attachment to the imide nitrogens of Formula 1a.

In another non-limiting embodiment of Formula 1a, L has Formula 1cc or formula 1dd:

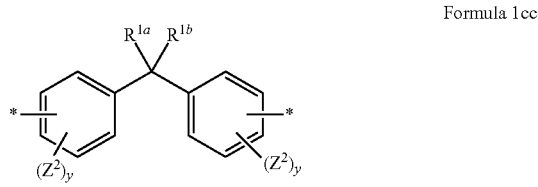

Formula 1cc

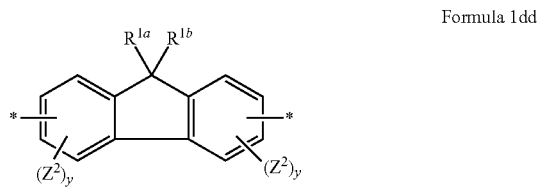

Formula 1dd where R$^{1a}$, and R$^{1b}$ are the same or different and can be selected from the group consisting of H, halogen, C$_{1-30}$ alkyl, C$_{1-C30}$ heteroalkyl, C$_{2-30}$ alkenyl, C$_{7-30}$ aralkyl, C$_{6-30}$ aryl, and C$_{4-30}$ heteroaryl; and Z$^2$, y, and * are as defined elsewhere herein.

In one non-limiting embodiment of Formula 1cc and Formula 1dd; R$^{1a}$ and R$^{1b}$ are F or CF$_3$.

In another non-limiting embodiment; L is an alicyclic ring selected from the group consisting of cyclopropane, cyclobutane, cyclopentane, cyclohexane, cycloheptane, cyclooctane, bicycloundecane, decalin, housane, and the like and similar species.

In another non-limiting embodiment of Formula 1a; L can be selected from the group consisting of the following species:

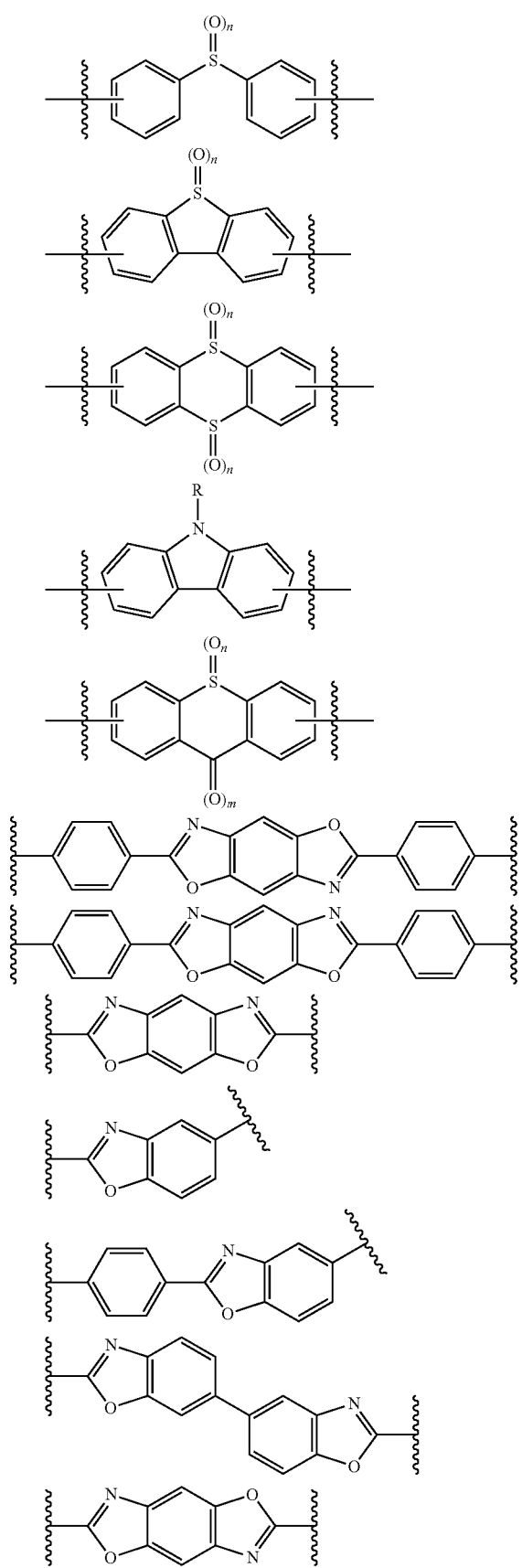

where R is selected from the group consisting of H, halogen, $C_{1-30}$ alkyl, $C_{1-C30}$ heteroalkyl, $C_{2-30}$ alkenyl, $C_{7-30}$ aralkyl, $C_{6-30}$ aryl, and $C_{4-30}$ heteroaryl; n is the same or different at each occurrence and is 0, 1, or 2; and m is 0 or 1.

In some non-limiting embodiments of Formula 2c, a=0 to 2. In some non-limiting embodiments of Formula 2c, a=0. In some non-limiting embodiments of Formula 2c, a=1. In some non-limiting embodiments of Formula 2c, a=2.

In one non-limiting embodiment, the second monomer comprising two or more cyclopentadienone moieties of the present disclosure can be represented by Formula 3:

Formula 3

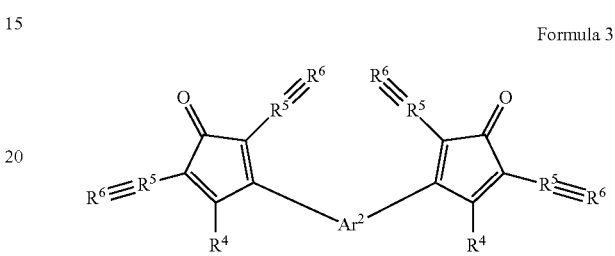

where $R^4$ is the same or different at each occurrence and is selected from the group consisting of H, substituted or unsubstituted $C_{1-6}$ alkyl, substituted or unsubstituted $C_{6-20}$ aryl, and substituted or unsubstituted $C_{4-20}$ heteroaryl; $R^5$ is the same or different at each occurrence and is selected from the group consisting of substituted or unsubstituted $C_{6-20}$ aryl and substituted or unsubstituted $C_{4-20}$ heteroaryl; $R^6$ is the same or different at each occurrence and is selected from the group consisting of substituted or unsubstituted $C_{1-6}$ alkyl, substituted or unsubstituted $C_{6-20}$ aryl, and substituted or unsubstituted $C_{4-20}$ heteroaryl; and $Ar^2$ is an aromatic moiety.

In some non-limiting embodiments of Formula 3, $R^5$ is the same or different at each occurrence and is selected from the group consisting of substituted or unsubstituted $C_{6-20}$ aryl and substituted or unsubstituted $C_{4-20}$ heteroaryl. In some non-limiting embodiments of Formula 3, $R^5$ is phenyl.

In some non-limiting embodiments of Formula 3, $R^6$ is the same or different at each occurrence and is selected from the group consisting of substituted or unsubstituted $C_{1-6}$ alkyl, substituted or unsubstituted $C_{6-20}$ aryl, and substituted or unsubstituted $C_{4-20}$ heteroaryl. In some non-limiting embodiments of Formula 3, $R^6$ is the same or different at each occurrence and is selected from the group consisting of substituted and unsubstituted $C_{6-20}$ aryl. In some non-limiting embodiments of Formula 3, $R^6$ is phenyl.

A wide variety of aromatic moieties are suitable for use as $Ar^2$, such as those disclosed in U.S. Pat. No. 5,965,679. Exemplary aromatic moieties useful for $Ar^2$ include those having the structure shown in Formula 4:

Formula 4

where q is an integer chosen from 1, 2 or 3; r is an integer chosen from 0, 1, or 2; each $Ar^a$ is independently chosen from:

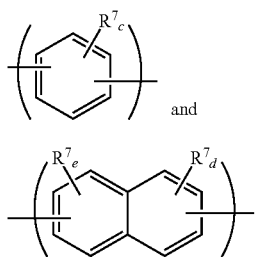

Formula 5 and

Formula 6 where $R^7$ is the same or different at each occurrence and is selected from the group consisting of halogen, substituted or unsubstituted $C_{1-6}$ alkyl, aryl, and aryloxy; c is an integer from 0 to 4; and d and e are the same or different at each occurrence and are each an integer from 0 to 3.

In some non-limiting embodiments of Formula 4, Z is the same or different at each occurrence and is chosen from a single covalent bond, an alkyl group, O, S, C(=O), $CR^{12}R^{13}$, and $SiR^{12}R^{13}$; where R", $R^{12}$, and $R^{13}$ are independently chosen from H, substituted or unsubstituted $C_{1-4}$ alkyl, such as $C_{1-4}$ haloalkyl, and phenyl. In some non-limiting embodiments of Formula 4, Z is the same or different at each occurrence and is chosen from O, S, $NR^{11}$, C(=O), $CR^{12}R^{13}$, and $SiR^{12}R^{13}$. In some non-limiting embodiments of Formula 4, Z is the same or different at each occurrence and is chosen from 0, S, C(=O), and $CR^{12}R^{13}$. In some non-limiting embodiments of Formula 4, Z is the same or different at each occurrence and is chosen from 0, C(=O), and $CR^{12}R^{13}$. In some non-limiting embodiments, each R", $R^{12}$, and $R^{13}$ are independently chosen from H, $C_{1-4}$ alkyl, fluoro $C_{1-4}$ alkyl, and phenyl. In some non-limiting embodiments, each $R^{11}$, $R^{12}$, and $R^{13}$ are independently chosen from H, $C_{1-4}$ alkyl, fluoro $C_{1-2}$ alkyl, and phenyl.

In some non-limiting embodiments of Formula 4, q=0 to 3. In some non-limiting embodiments of Formula 4, q=0. In some non-limiting embodiments of Formula 4, q=1. In some non-limiting embodiments of Formula 4, q=2. In some non-limiting embodiments of Formula 4, q=3. In some non-limiting embodiments of Formula 4, r=0 to 2. In some non-limiting embodiments of Formula 4, r=0. In some non-limiting embodiments of Formula 4, r=1. In some non-limiting embodiments of Formula 4, r=2.

In some non-limiting embodiments of Formula 5 and Formula 6, $R^7$ is independently chosen from halogen, substituted or unsubstituted $C_{1-4}$ alkyl, such as halo $C_{1-4}$ alkyl, $C_{1-4}$ alkoxy, halo $C_{1-4}$ alkoxy, and phenyl. In some non-limiting embodiments of Formula 5 and Formula 6, $R^7$ is independently chosen from fluoro, $C_{1-4}$ alkyl, fluoro $C_{1-4}$ alkyl, $C_{1-4}$ alkoxy, fluoro $C_{1-4}$ alkoxy, and phenyl.

In some non-limiting embodiments of Formula 5, c=0 to 4. In some non-limiting embodiments of Formula 5, c=0 to 3. In some non-limiting embodiments of Formula 5, c=0 to 2.

In some non-limiting embodiments of Formula 5, c=0 or 1. In some non-limiting embodiments of Formula 6, d and e are 0 to 3. In some non-limiting embodiments of Formula 6, d and e are 0 to 2. In some non-limiting embodiments of Formula 6, d and e are 0 to 1. In some non-limiting embodiments of Formula 6, d+e is 0 to 4. In some non-limiting embodiments of Formula 6, d+e is 0 to 2.

Some non-limiting examples of compounds having Formula 3 are:

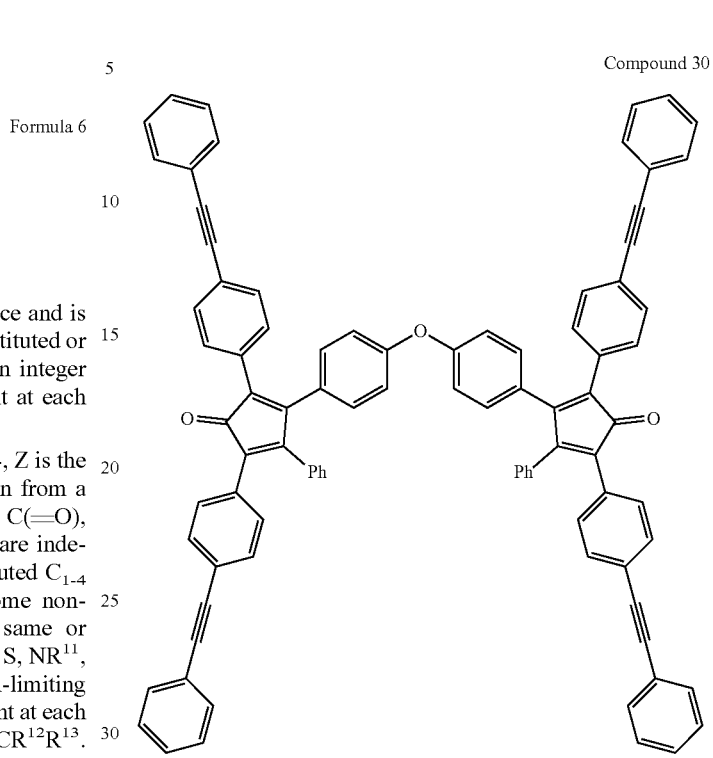

Compound 30

The polymers of the present invention are prepared by reacting one or more first monomers having two or more aromatic acetylene groups, one or more second monomers having two or more cyclopentadienone moieties, and optionally additional ingredients as disclosed herein, in a suitable organic solvent. The mole ratio of the total first monomers (that is, alkyne-containing monomers) to the total second monomers (that is, monomers containing two cyclopentadienone moieties) is from 1:1.2 to 1.95:1. In some non-limiting embodiments, the ratio is from 1:1.15 to 1.75:1. In some non-limiting embodiments, the ratio is from 1:1.1 to 1.2:1.

Suitable organic solvents useful to prepare the present oligomers are benzyl esters of $C_{2-6}$ alkanecarboxylic acids, dibenzyl esters of $C_{2-6}$ alkanedicarboxylic acids, tetrahydrofurfuryl esters of $C_{2-6}$ alkanecarboxylic acids, ditetrahydrofurfuryl esters of $C_{2-6}$ alkanedicarboxylic acids, phenethyl esters of $C_{2-6}$ alkanecarboxylic acids, diphenethyl esters of $C_{2-6}$ alkanedicarboxylic acids, aromatic ethers, carbonates, and lactones. Preferred aromatic ethers are diphenyl ether, dibenzyl ether, $C_{1-6}$ alkoxy-substituted benzenes and benzyl $C_{1-6}$ alkyl ethers, and more preferably $C_{1-4}$ alkoxy-substituted benzenes and benzyl $C_{1-4}$ alkyl ethers. Preferred organic solvents are benzyl esters of $C_{2-4}$ alkanecarboxylic acids, dibenzyl esters of $C_{2-4}$ alkanedicarboxylic acids, tetrahydrofurfuryl esters of $C_{2-4}$ alkanecarboxylic acids, ditetrahydrofurfuryl esters of $C_{2-4}$ alkanedicarboxylic acids, phenethyl esters of $C_{2-4}$ alkanecarboxylic acids, diphenethyl esters of $C_{2-4}$ alkanedicarboxylic acids, $C_{1-6}$ alkoxy-substituted benzenes, and benzyl $C_{1-6}$ alkyl ethers, more preferably benzyl esters of $C_{2-6}$ alkanecarboxylic acids, tetrahydrofurfuryl esters of $C_{2-6}$ alkanecarboxylic acids, phenethyl esters of $C_{2-6}$ alkanecarboxylic acids, $C_{1-4}$ alkoxy-substituted benzenes, benzyl $C_{1-4}$ alkyl ethers, dibenzyl ether, carbonates, and lactones, and yet more preferably benzyl esters of $C_{2-6}$ alkanecarboxylic acids, tetrahydrofurfuryl esters of $C_{2-6}$ alkanecarboxylic acids, $C_{1-4}$ alkoxy-substituted benzenes, benzyl $C_{1-4}$ alkyl ethers, carbonates, and lactones. Exemplary organic solvents include, without limitation, benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, benzyl methyl ether, benzyl ethyl ether, and propylene carbonate, and preferably benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, propylene carbonate, and gamma-butyrolactone.

The polymers of the present invention may be prepared by combining one or more first monomers, one or more second monomers, and any additional ingredients as disclosed herein, each as described above, in any order in a vessel, and heating the mixture. The second monomer may be combined with the organic solvent in a vessel, and then the first monomer and any optional additional monomers are added to the mixture. In one non-limiting embodiment, the second monomer and organic solvent mixture is heated to the desired reaction temperature before the first monomer is added. The first monomer may be added over a period of time, such as from 0.25 to 46 hours. In some non-limiting embodiments, the addition may be performed from 1 to 6 hours, to reduce exotherm formation, but is preferably added at one time. The second monomer and organic solvent mixture may be heated to the desired reaction temperature before the first monomer and any optional monomers are added. Alternatively, the second monomer, first monomer, and any additional ingredients are added to a vessel, and then heated to the desired reaction temperature and held at this temperature for a period of time to provide the desired oligomer. The reaction mixture is then heated at a suitable temperature. In some non-limiting embodiments, this temperature is from 85 to 205° C. In some non-limiting embodiments, this temperature is from 85 to 205° C. In some non-limiting embodiments, this temperature is from 90 to 160° C. In some non-limiting embodiments, this temperature is from 100 to 130° C. The first and second monomers may react at temperatures below those conventionally used to make polyarylene polymers by a Diels-Alder type reaction.

The present polyarylene polymers may have any suitable molecular weight range, such as a weight average molecular weight ($M_w$) of from 500 to 250000 Da (as determined by gel permeation chromatography against polystyrene standards). In some non-limiting embodiments, this range is 1000 to 100000 Da. In some non-limiting embodiments, this range is 2000 to 50000 Da. The choice of organic solvent can be used to tailor the $M_w$ of the resulting oligomer. For example, when aromatic ether solvents, such as $C_{1-6}$ alkoxy-substituted benzenes, are used, relatively higher $M_w$ oligomers may be obtained as compared to oligomers having a relatively lower $M_w$ when the same reaction is performed using a benzyl ester of a $C_{2-6}$ alkanecarboxylic acid as the organic solvent. The molecular weight of the present oligomers can also be controlled, even in aromatic ether solvents, by adjusting the amount of the first monomer and/or optional monomers. For example, to obtain an oligomer having a $M_w$ of ≤35000, >1.05 mole of the first monomer should be used for each 1 mole of the second monomer, that is, the mole ratio of total alkyne monomers (that is, total second monomers) to total first monomers should be ≥1:1.05, such as from 1:1.075 to 1:1.95.

While not intending to be bound by theory, it is believed that the present polyarylene polymers are formed through the Diels-Alder reaction of the cyclopentadienone moieties of the second monomer with the alkynyl moieties of the first monomer upon heating. During such Diels-Alder reaction, a carbonyl-bridged species forms. It will be appreciated by those skilled in the art that such carbonyl-bridged species may be present in the oligomers as the polymer molecular weight grows. Upon further heating, the carbonyl bridging species will be essentially fully converted to an aromatic ring system. Not wishing to be bound by theory, it is believed that no unreacted cyclopentadienone moieties remain in the present oligomers.

In some non-limiting embodiments of the coating comprising a polymeric layer disclosed herein, the polymeric layer additionally contains a crosslinker. In some non-limiting embodiments, the crosslinker is referred to as a crosslinking compound or as another term that would be known to one of skill in the art.

Depending on the particular polymer in the coating, it may be desirable to include a crosslinker in the coating polymeric composition, for example, to provide improved mechanical properties such as strength or elasticity to the polymer in the coating. Suitable crosslinkers will depend on the polymer in the coating composition and may be chosen, for example, from: melamine compounds such as hexamethylol melamine, hexamethoxymethyl melamine, hexamethylol melamine compounds having 1 to 6 methylol groups methoxymethylated, hexamethoxyethyl melamine, hexacyloxymethyl melamine, and hexamethylol melamine compounds having 1 to 6 methylol groups acyloxymethylated; guanamine compounds such as tetramethylol guanamine, tetramethoxymethyl guanamine, tetramethylol guanamine compounds having 1 to 4 methylol groups methoxymethylated, tetramethoxyethyl guanamine, tetraacyloxyguanamine, tetramethylol guanamine compounds having 1 to 4 methylol groups acyloxymethylated, and benzoquanamine compounds; glycoluril compounds having substituted thereon at least one group chosen from methylol, alkoxymethyl and acyloxymethyl groups such as tetramethylol glycoluril, tetramethoxyglycoluril, tetramethoxymethyl glycoluril, tetramethylol glycoluril compounds having 1 to 4 methylol groups methoxymethylated, and tetramethylol glycoluril compounds having 1 to 4 methylol groups acyloxymethylated; urea compounds having substituted thereon at least one group chosen from methylol, alkoxymethyl and acyloxymethyl groups such as tetramethylol urea, tetramethoxymethyl urea, tetramethylol urea compounds having 1 to 4 methylol groups methoxymethylated, and tetramethoxyethyl urea; epoxy compounds such as such as tris(2,3-epoxypropyl)isocyanurate, trimethylolmethane triglycidyl ether, trimethylolpropane triglycidyl ether, and triethylolethane triglycidyl ether; isocyanate compounds, azide compounds; hydroxy-containing compounds; or compounds having a double bond such as an alkenyl ether group. These compounds may be used as an additive or introduced into a polymer side chain as a pendant group. A crosslinker, if used, is typically present in the coating polymer composition in an amount from 0.5 to 50 wt % or from 0.5 to 25 wt % based on total solids of the coating polymer composition. In some non-limiting embodiments, the crosslinker is present in the coating polymer composition in an amount from 5 to 20 wt % based on total solids of the coating polymer composition.

In some non-limiting embodiments of the polymeric layer disclosed herein, the crosslinker is selected from the group consisting of melamine compounds, guanamine compounds, benzoquanamine compounds, glycoluril compounds, urea compounds, epoxy compounds, isocyanate compounds, azide compounds, hydroxide-containing compounds, and alkenyl compounds. In some non-limiting embodiments of the polymeric layer disclosed herein, the crosslinker is selected from the group consisting of glycoluril compounds and epoxy compounds.

Depending on the particular polymer in the coating, it may be desirable to include a thermal acid generator in the coating polymeric composition, for example, to allow the curing step to be performed at a lower temperature. Suitable thermal acid generators will depend on the polymer in the coating composition and may be chosen, for example, from:

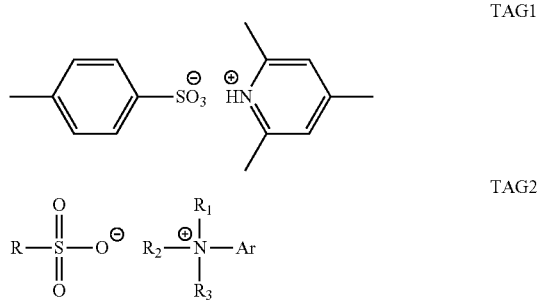

where TAG2 is commercially available, for example, from King Industries under the trade name "K-Pure TAG."

A thermal acid generator, if used, is typically present in the coating polymer composition in an amount from 0.25 to 25 wt % or from 0.5 to 15 wt % based on total solids of the coating polymer composition. In some non-limiting embodiments, the thermal acid generator is present in the coating polymer composition in an amount from 0.5 to 5 wt %.

In some non-limiting embodiments, the present disclosure is directed to an optical thin film comprising a polymeric layer, wherein the polymeric layer comprises a reaction product of a first monomer comprising two or more aromatic acetylene groups and a second monomer comprising two or more cyclopentadienone groups, or a cured product of the reaction product. In some non-limiting embodiments, the present disclosure is further directed to an optical thin film comprising a polymeric layer, wherein the polymeric layer comprises a reaction product of a first monomer comprising two or more aromatic acetylene groups, a second monomer comprising two or more cyclopentadienone groups, and a crosslinker; or a cured product of the reaction product.

Specific, non-limiting embodiments for the first monomer comprising two or more aromatic acetylene groups, the second monomer comprising two or more cyclopentadienone groups, the crosslinkers, cure conditions and other parameters associated with the optical thin film are the same as those disclosed for the coatings described herein.

The polymer of the polymeric layer in either case, in an organic reaction solvent, can be directly cast as a film, applied as a coating or poured into a non-solvent to precipitate the oligomer or polymer. Water, methanol, ethanol and other similar polar liquids such as glycol ethers are typical non-solvents which can be used to precipitate the polymer. Solid polymer may be dissolved and processed from a suitable organic solvent described above, or from organic solvents typically used in the electronics industry, such as propylene glycol methyl ether (PGME), propylene glycol methyl ether acetate (PGMEA), methyl 3-methoxypropionate (MMP), ethyl lactate, n-butyl acetate, anisole, N-methyl pyrrolidone, gamma-butyrolactone (GBL), ethoxybenzene, benzyl propionate, benzyl benzoate, propylene carbonate, and mixtures thereof. Mixtures of organic solvents are particularly preferred, such as a mixture comprising one or more of anisole, ethoxybenzene, PGME, PGMEA, GBL, MMP, n-butyl acetate, benzyl propionate and benzyl benzoate in combination with one or more additional organic solvents, and more preferably a mixture comprising two or more of anisole, ethoxybenzene, PGME, PGMEA, GBL, MMP, n-butyl acetate, benzyl propionate, and benzyl benzoate. When a mixture of solvents is used, the ratio of solvents is generally not critical and may vary from 99:1 to 1:99 w/w. It will be appreciated by those skilled in the art that the concentration of the polymer in the organic reaction solvent may be adjusted by removing a portion of the organic solvent, or by adding more of the organic solvent, as may be desired.

For coating formation, the coating polymer compositions can be applied by spin-coating, dipping, drop-casting, roller-coating, screen printing, ink-jet printing, gravure or other conventional coating techniques. In the electronics manufacturing industry, spin-coating and slot-die coating are preferred methods to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the composition dispensed on the substrate depends on the total solids content in the composition, the desired thickness of the resulting coating layer, and other factors well-known to those skilled in the art.

Substrates onto which the materials may be coated are those generally used in the art. In some non-limiting embodiments, the substrates used are selected from the group consisting of silica, Si wafers, silicon nitride, silicon oxynitride, silicon carbide, silicon-germanium, gallium-arsenide, indium-phosphide, aluminum nitride, alumina, glass, and the like. In some non-limiting embodiments, the substrates used are selected from the group consisting of silica, Si wafers, silicon nitride, and silicon carbide. In some non-limiting embodiments, the substrate used is Si wafers. In some non-limiting embodiments, the substrate used is glass.

The thickness of the coating and/or optical thin film is not particularly limited and will depend, for example, on the particular application or use. In some non-limiting embodiments, the thickness of the coating and/or optical thin film is between 50 nm and 20 µm. In some non-limiting embodiments, the thickness of the coating and/or optical thin film is between 50 nm and 5 µm. In some non-limiting embodiments, the thickness of the coating and/or optical thin film is between 50 nm and 1 µm. In some non-limiting embodiments, the thickness of the coating and/or optical thin film is between 60 nm and 500 nm. In some non-limiting embodiments, the thickness of the coating and/or optical thin film is between 70 nm and 250 nm. In some non-limiting embodiments, the thickness of the coating and/or optical thin film is between 80 nm and 200 nm. In some non-limiting embodiments, the thickness of the coating and/or optical thin film is between 90 nm and 150 nm. In some non-limiting embodiments, the thickness of the coating and/or optical thin film is between 100 nm and 125 nm.

Preferably, after being coated on a substrate surface, the polymer composition is heated (soft baked) to remove any organic solvent present. Typical baking temperatures are from 90 to 140° C., although other suitable temperatures may be used. Such baking to remove residual solvent is typically done for approximately 30 sec. to 2 min., although longer or shorter times may suitably be used. Following solvent removal, a layer, film or coating of the polymer on the substrate surface is obtained.

After the soft-bake step, the coating is typically cured at elevated temperature to remove substantially all of the solvent from the polymeric layer, thereby forming a tack-free coating and improving adhesion of the layer to the underlying structure. Depending on the particular polymer and components of the composition, the cure may cause further change to the polymer, for example, through one or more of oxidation, outgassing, polymerization, condensation, or cross-linking. The cure is typically conducted on a hotplate or in an oven. The cure can be conducted, for example, in an atmosphere of air or inert gas such as nitrogen, argon or helium, or can be conducted under vacuum. In one non-limiting embodiment, the polymeric layer is cured in an inert gas atmosphere. In one non-limiting embodiment, the polymeric layer is cured under ambient atmospheric conditions. The temperature and time for the cure will depend, for example, on the particular polymer and solvent of the sensing polymer composition, and the layer thickness. In some non-limiting embodiments, cure temperatures are from 100 to 450° C. In some non-limiting embodiments, cure temperatures are 300 to 400° C., or from 325 to 350° C. In coatings wherein the polymeric layer comprises a crosslinker and/or a thermal acid generator, lower cure temperatures can sometimes be used. In some non-limiting embodiments, these lower cure temperatures are from 50 to 250° C. In some non-limiting embodiments, these lower cure temperatures are from 150 to 200° C. In one non-limiting embodiment, wherein the polymeric layer comprises a crosslinker and a thermal acid generator, the cure temperature is 200° C. In some non-limiting embodiments, the cure time is from 30 seconds to two hours. In one non-limiting embodiment, the cure time is 5 minutes. In some non-limiting embodiments, the cure time is from 10 minutes to 60 minutes. In one non-limiting embodiment, the cure time is 30 minutes. The cure can be conducted in a single step or in multiple steps. The cure can be conducted by heating the polymeric sensing composition layer at constant temperature or with a varied temperature profile such as a ramped or terraced temperature profile.

Preferred coating polymer compositions, such as those cured at conditions disclosed herein, can exhibit beneficial characteristics as coatings or optical films. Without wishing to be bound by any particular theory, it is believed that curing of the coating polymer compositions under conditions disclosed herein can effectively crosslink the polymer while minimizing or eliminating oxidation. The presence and extent of crosslinking of the coating polymer can be seen by the combination of FTIR and Raman spectra of the cured coating polymer layer. In one aspect, preferred cured polymeric sensing layers exhibit FTIR spectra having a preferred ratio of total peak area from 1648 to 1690 cm' to total peak area from 1480 to 1522 cm' of 0.2 or less. The FTIR peak ratio is believed to be demonstrative of the extent of oxidation of the pre-cured coating polymer that occurs during the curing process. In another aspect, preferred polymeric coating layers exhibit Raman spectra having a preferred ratio of total peak area from 2190 to 2250 cm' to total peak area from 1550 to 1650 cm' of 1.0 or more. The Raman peak ratio is believed to be demonstrative of the extent of reaction of alkynes in the pre-cured coating polymer that occurs during the curing process.

In some non-limiting embodiments, the coatings and/or optical thin films of the present disclosure have a thickness of at least 50 nm. In some non-limiting embodiments, the coatings and/or optical thin films of the present disclosure have a thickness of at least 75 nm. In some non-limiting embodiments, the coatings and/or optical thin films of the present disclosure have a thickness of at least 90 nm. In some non-limiting embodiments, the coatings and/or optical thin films of the present disclosure have a thickness of at least 100 nm. In some non-limiting embodiments, the coatings and/or optical thin films of the present disclosure have a thickness of at least 120 nm. In some non-limiting embodiments, the coatings and/or optical thin films of the present disclosure have a thickness of at least 150 nm.

In some non-limiting embodiments, the coatings and/or optical thin films of the present disclosure have a refractive index measured at 550 nm that is greater than 1.50. In some non-limiting embodiments, the coatings and/or optical thin films of the present disclosure have a refractive index measured at 550 nm that is greater than 1.60. In some non-limiting embodiments, the coatings and/or optical thin films of the present disclosure have a refractive index measured at 550 nm that is greater than 1.68. In some non-limiting embodiments, the coatings and/or optical thin films of the present disclosure have a refractive index measured at 550 nm that is greater than 1.70. In some non-limiting embodiments, the coatings and/or optical thin films of the present disclosure have a refractive index measured at 550 nm that is greater than 1.80.

Electronic devices that may benefit from having one or more layers comprising the optical thin films disclosed herein include, but are not limited to, (1) devices that convert electrical energy into radiation (e.g., a light-emitting diode, light emitting diode display, diode laser, or lighting panel), (2) devices that detect a signal using an electronic process (e.g., a photodetector, a photoconductive cell, a photoresistor, a photoswitch, a phototransistor, a phototube, an infrared ("IR") detector, or a biosensors), (3) devices that convert radiation into electrical energy (e.g., a photovoltaic device or solar cell), (4) devices that convert light of one wavelength to light of a longer wavelength, (e.g., a down-converting phosphor device); (5) devices that include one or more electronic components that include one or more organic semiconductor layers (e.g., a transistor or diode), or any combination of devices in items (1) through (5). In some non-limiting examples, the devices are display devices.

In some embodiments, the device includes an anode and a cathode with a photoactive layer therebetween. The device generally has a structure that is well known to those skilled in the art and comprises a first electrical contact layer (anode), and a second electrical contact layer (cathode), and a photoactive layer between them. Adjacent to the anode is a hole injection layer. Adjacent to the hole injection layer is a hole transport layer, comprising hole transport material. Adjacent to the cathode may be an electron transport layer, comprising an electron transport material. As an option, devices may use one or more additional hole injection or hole transport layers next to the anode and/or one or more additional electron injection layer or electron transport layer next to the cathode. As a further option, devices may have an anti-quenching layer between the photoactive layer and the electron transport layer.

In some embodiments, the different layers have the following range of thicknesses: anode, 50-500 nm, in some embodiments, 100-200 nm; hole injection layer, 5-200 nm, in some embodiments, 20-100 nm; hole transport layer, 5-200 nm, in some embodiments, 20-100 nm; photoactive layer, 1-200 nm, in some embodiments, 10-100 nm; electron transport layer, 5-200 nm, in some embodiments, 10-100 nm; cathode, 20-1000 nm, in some embodiments, 30-500 nm. The location of the electron-hole recombination zone in the device, and thus the emission spectrum of the device, can be affected by the relative thickness of each layer. The desired ratio of layer thicknesses will depend on the exact nature of the materials used.

In some embodiments, the photoactive layer includes a host material and a dopant. In some embodiments, a second host material is present. In some embodiments, minor amounts of other materials are present so long as they do not significantly change the function of the layer. Dopants are well known and broadly disclosed in the patent literature and technical journals. Exemplary dopants include, but are not limited to, anthracenes, benzanthracenes, benz[de]anthracenes, chrysenes, pyrenes, triphenylenes, benzofluorenes, other polycyclic aromatics, and analogs having one or more heteroatoms. Exemplary dopants also include, but are not limited to, benzofurans, dibenzofurans, carbazoles, benzocarbazoles, carbazolo-carbazoles, and azaborines. In some embodiments, the dopants have one or more diarylamino substituents. Dopants have been disclosed in, for example, U.S. Pat. Nos. 7,816,017, 8,465,848, 9,112,157, U.S. 2006/0127698, U.S. 2010/0032658, U.S. 2018/0069182, U.S. 2019/0058124, CA 3107010, EP 3109253, WO 2019003615, and WO 2019035268. In some embodiments, host materials are selected from the group consisting of anthracenes, chrysenes, pyrenes, phenanthrenes, triphenylenes, phenanthrolines, naphthalenes, triazines, quinolines, isoquinolines, quinoxalines, phenylpyridines, benzodifurans, metal quinolinate complexes, indolocarbazoles, substituted derivatives thereof, and combinations thereof.

The other layers in the device can be made of any materials which are known to be useful in such layers. The anode is an electrode that is particularly efficient for injecting positive charge carriers. It can be made of, for example, materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also be made of an organic material such as polyaniline as described in "Flexible light-emitting diodes made from soluble conducting polymer," Nature vol. 357, pp 477-479 (11 Jun. 1992). At least one of the anode and cathode should be at least partially transparent to allow the generated light to be observed.

The hole injection layer includes hole injection material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The hole injection layer can include charge transfer compounds, and the like, such as copper phthalocyanine, 1,4,5,8,9,12-hexaazatriphenylenehexacarbonitrile (HAT-CN), and the tetrathiafulvalene-tetracyanoquinodimethane system (TTF-TCNQ). In some embodiments, the hole injection layer includes at least one electrically conductive polymer and at least one fluorinated acid polymer.

Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3[p-(diethylamino)styryl]-5-[p-(diethylamino)phenyl] pyrazoline (PPR or DEASP), 1,2-trans-bis (9H-carbazol-9-yl)cyclobutane (DCZB), N,N,N',N'-tetrakis (4-methyl-phenyl)-(1,1'-biphenyl)-4,4'-diamine (TTB), N,N'-bis(naphthalen-1-yl)-N,N'-bis-(phenyl)benzidine (NPB), and porphyrinic compounds, such as copper phthalocyanine. In some embodiments, the hole transport layer includes a hole transport polymer. In some embodiments, the hole transport polymer is a distyrylaryl compound. In some embodiments, the aryl group has two or more fused aromatic rings. In some embodiments, the aryl group is an acene. The term "acene" as used herein refers to a hydrocarbon parent component that contains two or more ortho-fused benzene rings in a straight linear arrangement. Other commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable.

In some embodiments, the hole transport layer further includes a p-dopant. In some embodiments, the hole transport layer is doped with a p-dopant. Examples of p-dopants include, but are not limited to, tetrafluorotetracyanoquinodimethane (F4-TCNQ) and perylene-3,4,9,10-tetracarboxylic- 3,4,9,10-dianhydride (PTCDA). In some embodiments, more than one hole transport layer is present.

Examples of electron transport materials include, but are not limited to, metal chelated oxinoid compounds, including metal quinolate derivatives such as tris(8-hydroxyquinolato)-aluminum (AlQ), bis(2-methyl-8-quinolinolato)(p-phenylphenolato)aluminum (BAlq), tetrakis-(8-hydroxyquinolato)hafnium (HfQ) and tetrakis-(8-hydroxyquinolato) zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; fluoranthene derivatives, such as 3-(4-(4-methylstyryl)phenyl-p-tolylamino)fluoranthene; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further includes an n-dopant. N-dopant materials are well known. The n-dopants include, but are not limited to, Group 1 and 2 metals; Group 1 and 2 metal salts, such as LiF, CsF, and Cs2CO3; Group 1 and 2 metal organic compounds, such as Li quinolate; and molecular n-dopants, such as leuco dyes, metal complexes, such as W2(hpp)4 where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

In some embodiments, an anti-quenching layer may be present between the photoactive layer and the electron transport layer to prevent quenching by the electron transport layer. To prevent energy transfer quenching, the singlet energy of the anti-quenching material has to be higher than the singlet energy of the emitter. To prevent electron transfer quenching, the LUMO level of the anti-quenching material has to be shallow enough (with respect to the vacuum level) such that electron transfer between the emitter exciton and the anti-quenching material is endothermic. Furthermore, the HOMO level of the anti-quenching material has to be deep enough (with respect to the vacuum level) such that electron transfer between the emitter exciton and the anti-quenching material is endothermic. In general, anti-quenching material is a large band-gap material with high singlet and triplet energies.

The cathode is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Alkali metal-containing inorganic compounds, such as LiF, CsF, Cs2O and Li2O, or Li-containing organometallic compounds can also be deposited between the organic layer 150 and the cathode layer 160 to lower the operating voltage. This layer may be referred to as an electron injection layer.

In some non-limiting embodiments, other layers may also be present in display devices. The choice of materials for each of the component layers is preferably determined by balancing the positive and negative charges in the emitter layer to provide a device with high electro-luminescence efficiency.

The device layers can be formed by any deposition technique, or combinations of techniques, including vapor deposition, liquid deposition, and thermal transfer.

In some embodiments, the device is fabricated by liquid deposition of the hole injection layer, the hole transport layer, and the photoactive layer, and by vapor deposition of the anode, the electron transport layer, an electron injection layer and the cathode. Suitable liquid deposition techniques are well known in the art. In some embodiments, all the device layers are fabricated by vapor deposition. Such techniques are well known in the art.

This layer structure, and the mismatch of refractive indices between adjacent layers, can greatly reduce the overall efficiency of these devices. Light generated in the emissive layer is lost via scattering and internal reflection. Another potential issue is cross-talk between pixels in OLEDS can lead to efficiency losses that result from unwanted communication between red, green, and blue pixels. The coatings and optical thin films disclosed herein can be used to dampen the refractive index gradient through a device. In some non-limiting embodiments, the coatings and optical thin films disclosed herein can be used as relatively-high-refractive index light-extraction layer between an OLED encapsulant layer and polarizer layer to greatly increase number of photons emitted from a top-display device. In some non-limiting embodiments, the coatings and optical thin films disclosed herein can be used in the formation of relatively low-refractive-index banks between pixels in the emissive layer of an OLED to significantly reduce cross-talk and generate improved efficiencies. Importantly, the refractive indices of the coatings and optical thin films can be tuned via curing processes within a particular composition to accommodate the material changes made elsewhere in the device stack as optimum performance is sought.

The coatings and optical thin films, and their associated properties, according to the present disclosure may be prepared and used according to the examples set out below. The examples are presented herein for purposes of illustration of the present disclosure and are not intended to limit the scope of the invention described in the claims.

EXAMPLES

Polymer Synthesis

The following Polymers A-L and Comparative Polymers 1-4 were synthesized using the procedures described below. Number average molecular weight ($M_n$), weight average molecular weight ($M_w$) and polydispersity (PDI=$M_w/M_n$), where reported, were determined by gel permeation chromatography (GPC) based on polystyrene standard. Comparative Polymer 4 is a commercial material sold as SiLK™ J polyarylene resin by Dupont Electronics & Imaging.

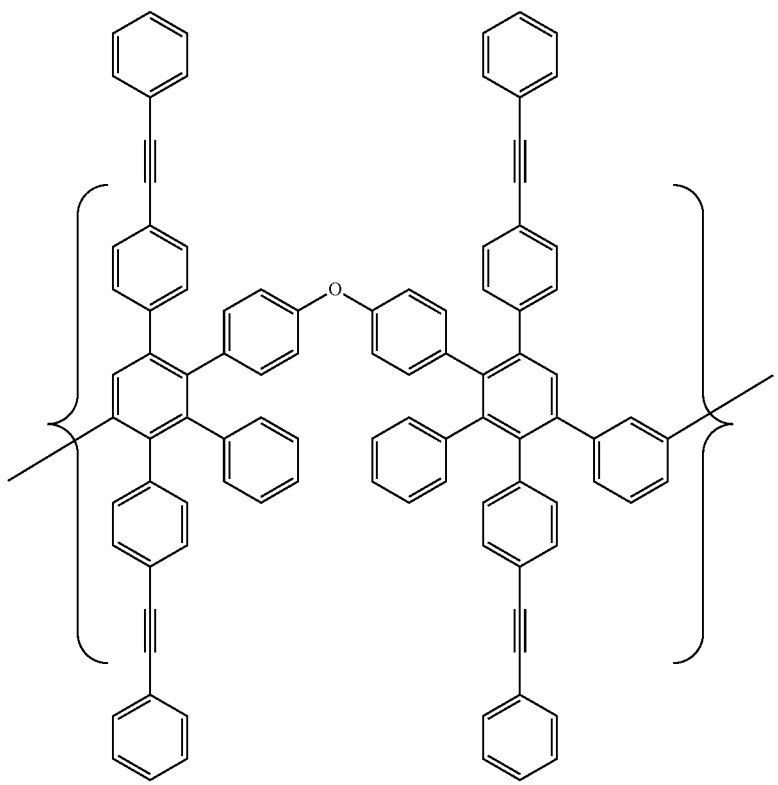
Polymer A
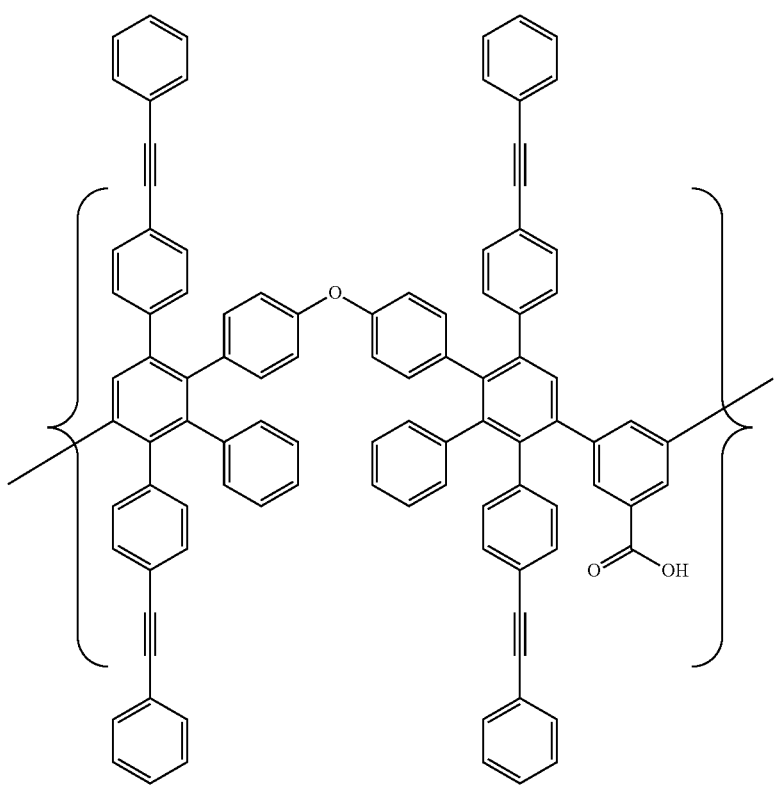
Polymer B

Polymer C
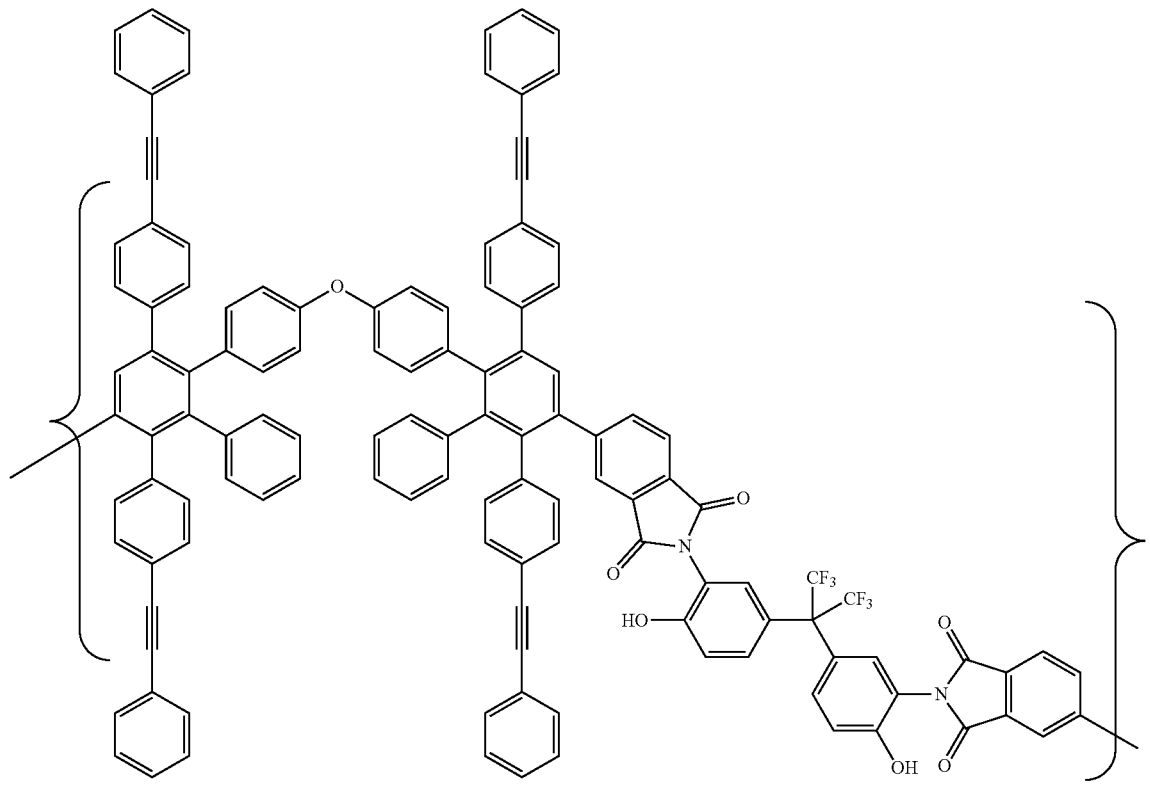
Polymer D
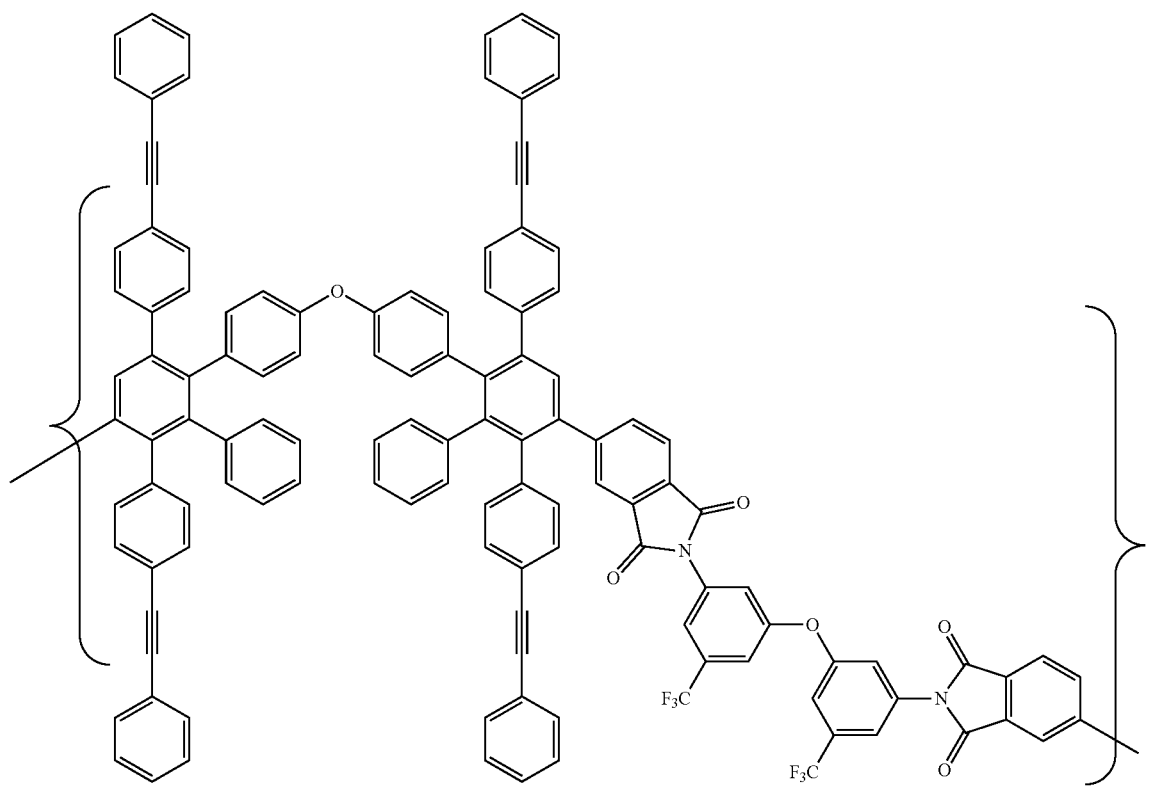

-continued
Comparative Polymer 1
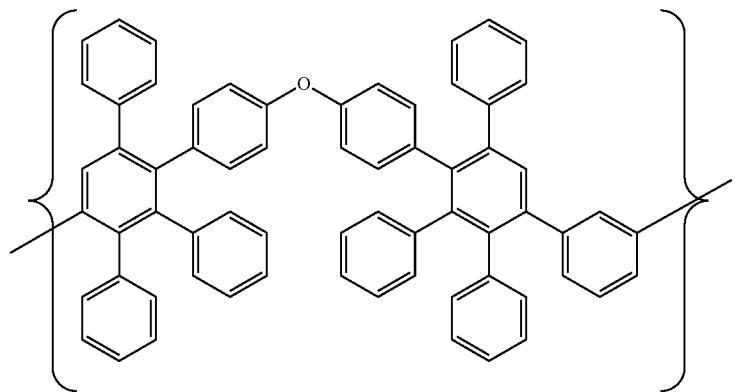
Comparative Polymer 2
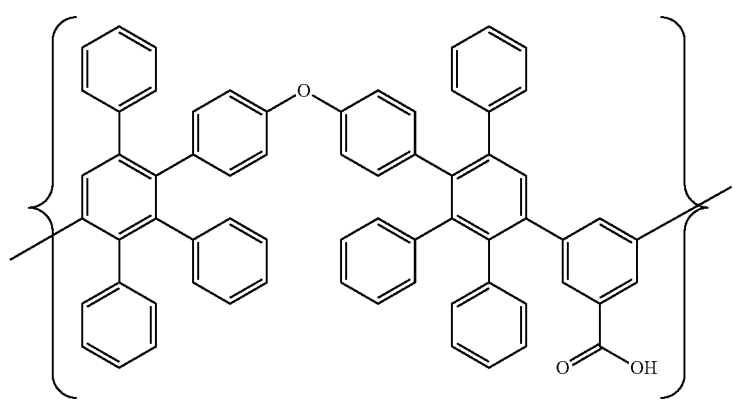
Comparative Polymer 3
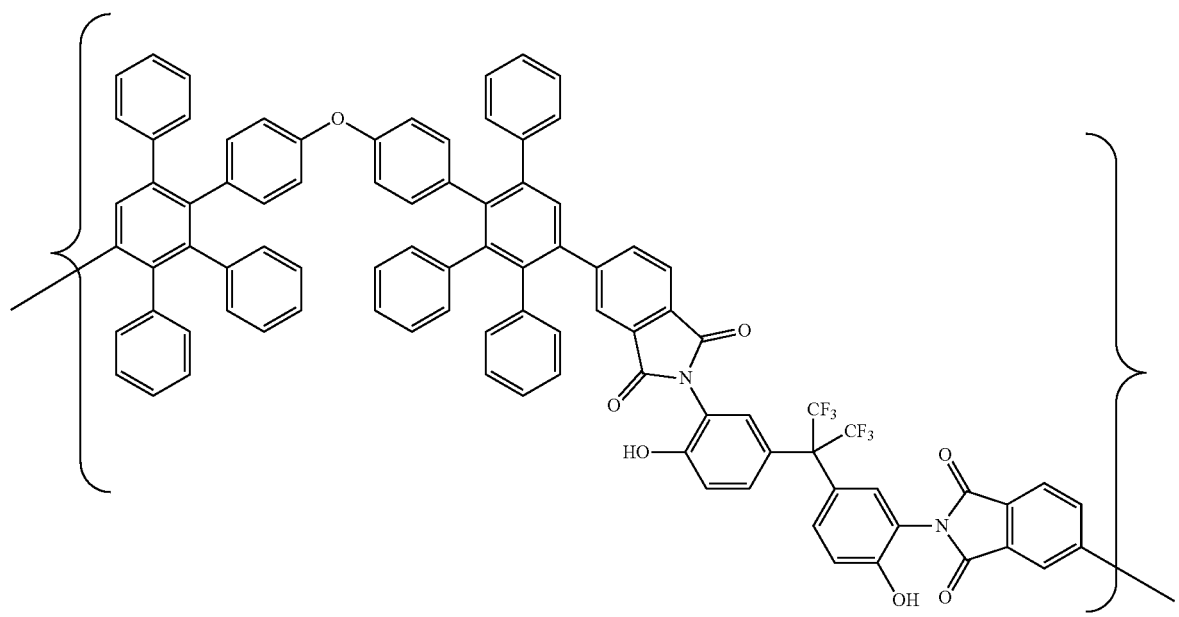

Comparative Polymer 4

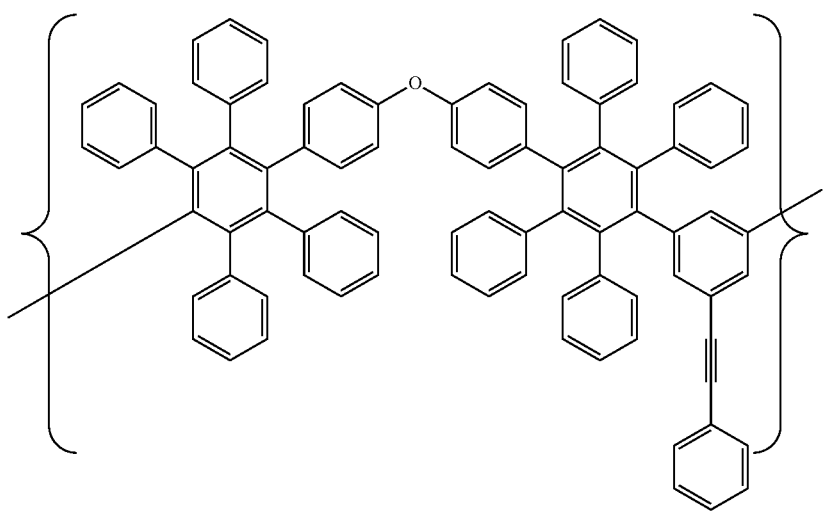

Synthetic Example 1

4,4'-(oxybis(4,1-phenylene))bis(3-phenyl-2,5-bis(4-(phenylethynyl)phenyl)cyclopenta-2,4-dien-1-one) (A4B2) (200 g, 1 equivalent) and 1,3-diethynylbenzene (21.7 g, 1.02 equivalent) were added to a 1 L OptiMax reactor (glass lined, with TEFLON™ fluoropolymer drainage plug). Anisole solvent was added in an amount to provide a solution containing 30 wt % solids to form a deep maroon heterogeneous mixture. The reactor was transferred to an OptiMax Synthesis Workstation and sealed under an atmosphere of nitrogen gas. To the reactor top were affixed a stirring rod with a 4-paddle stirrer (elevated to 1 cm from the reactor bottom), a water-cooled reflux condenser, an internal thermocouple (placed at the median depth of the mixture, radially disposed halfway between the stirring shaft and the reactor wall), and a 1-cm baffle (placed perpendicular and adjacent to the outer wall of the reactor). The reactor was set to an internal temperature of 25° C. and stirring was initiated at 100 rpm to mix the heterogeneous contents. After a 30-minute equilibration period at 25° C., the reactor was warmed at a rate of 1° C./min. until reaching an internal temperature of 115 to 135° C. The reactor was maintained at target temperature for a period of 72 hours. The reactor was then cooled to 25° C. at a rate of 1° C./min. The contents of the reactor were then transferred through the outlet at the bottom of the reactor to a bottle, yielding Polymer A. [Polymer A: $M_n$=19.6 kDa; $M_w$=49.7 kDa; PDI=2.53].

Synthetic Example 2

A4B2 (1 equivalent) and 3,5-diethynylbenzoic acid (DEBzOH, 1.01 equivalent) were added to a 1-L OptiMax reactor (glass lined, with TEFLON™ fluoropolymer drainage plug). PGMEA solvent was added in an amount to provide a solution containing 30 wt % solids to form a deep maroon heterogeneous mixture. The reactor was transferred to an OptiMax Synthesis Workstation and sealed under an atmosphere of nitrogen gas. To the reactor top were affixed a stirring rod with a 4-paddle stirrer (elevated to 1 cm from the reactor bottom), a water-cooled reflux condenser, an internal thermocouple (placed at the median depth of the mixture, radially disposed halfway between the stirring shaft and the reactor wall), and a 1-cm baffle (placed perpendicular and adjacent to the outer wall of the reactor). The reactor was set to an internal temperature of 25° C. and stirring was initiated at 100 rpm to mix the heterogeneous contents. After a 30-min. equilibration period at 25° C., the reactor was warmed at a rate of 1° C./min. until reaching an internal temperature of 120° C. The reactor temperature was maintained at target temperature for a period of 24 hours. The reactor was then cooled from 120° C. to 30° C. at a rate of 1° C./min. The contents of the reactor were then transferred through the outlet at the bottom of the reactor to a bottle, yielding Polymer B. [Polymer B: $M_n$=15.0 kDa; $M_w$=45.0 kDa; PDI=3.01]. The polymer was then precipitated with 10× acetone and vacuum filtered to yield a powder. The powdered polymer was then transferred into a 250 mL round bottom along with an equal amount of phenylactylene with PGMEA as solvent. This mixture was allowed to react at 105° C. for two days before being precipitated in 10× acetone, allowed to stir over the weekend, resuspended in acetone and allowed to stir overnight before vacuum filtering and dying the powder in a vacuum oven. [Polymer M: $M_n$=27.0 kDa; $M_w$=53.0 kDa; PDI=1.97].

Synthetic Example 3

Compound 1 monomer (0.712 g, 1.06 mmol, 1.25 eq.) and A4B2 (1.000 g, 0.845 mmol, 1 eq.) were combined with 6 mL gamma-butryolactone (GBL) in a 20-mL round-bottom flask equipped with a magnetic stir bar under nitrogen atmosphere. The round-bottom flask was fitted with a Claisen adapter affixed with a thermometer probe extending into the reaction mixture and a water-cooled condenser fitted to the side arm. The mixture temperature was increased with magnetic stirring to 150° C. for 12 hr using a thermostatic temperature controller. After cooling to room temperature, the reaction mixture was diluted to 4 times the original volume with acetone.

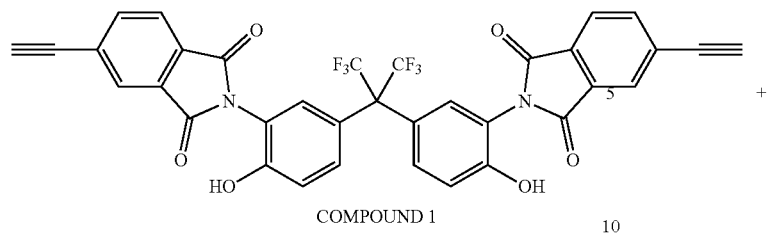
COMPOUND 1
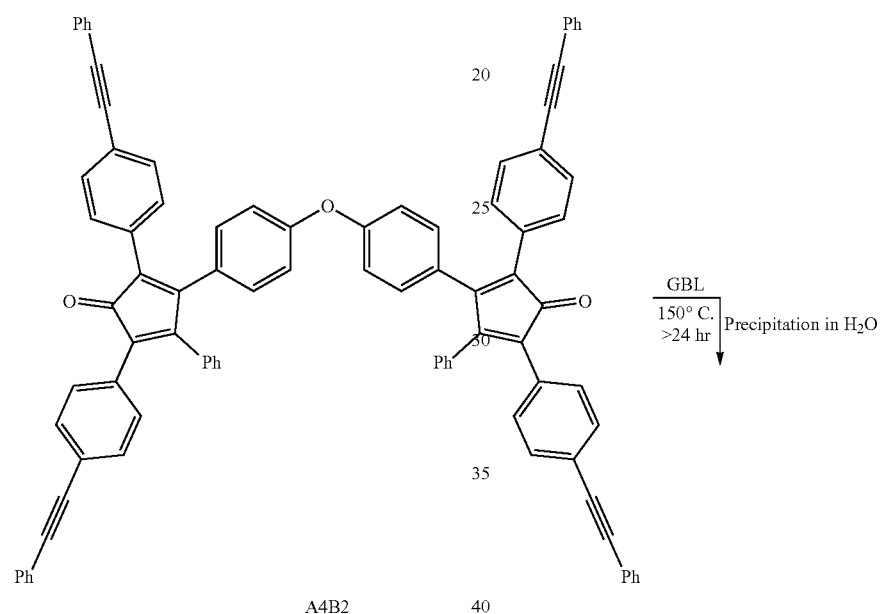
A4B2
GBL
150° C.
>24 hr | Precipitation in H₂O
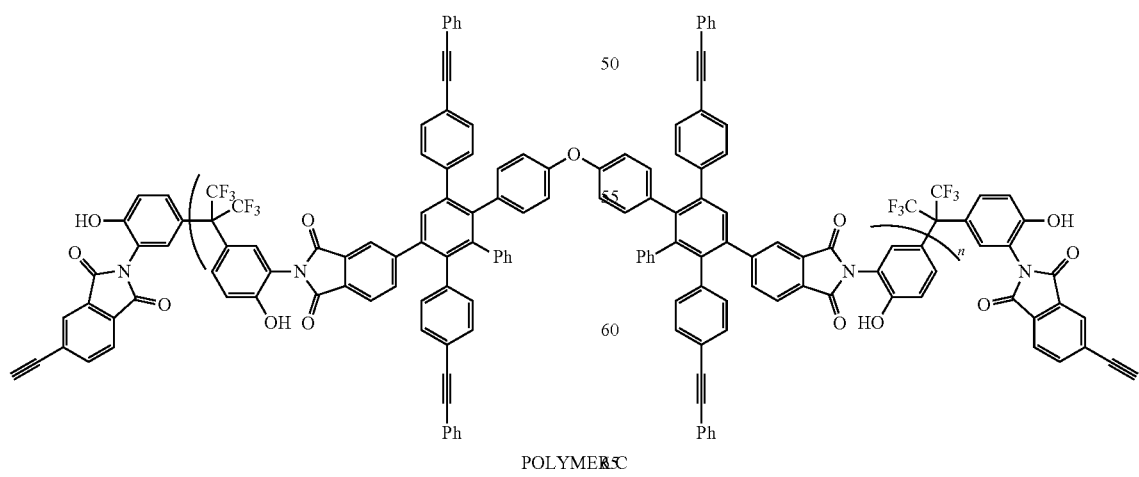
POLYMER 5C Solid polymer was precipitated slowly by dripping the diluted solution via separatory funnel into 100-mL of stirred room-temperature deionized water. The resulting cloudy suspension of solid polymer was vacuum filtered to provide the wet solid polymer that was washed with 250-mL room-temperature deionized water by stirring in a 500-mL beaker for 1 hour. The solids were vacuum filtered, placed in a 60° C. heated vacuum oven, and dried under high vacuum for 48 hours. The dried Polymer C (1.602 g) was isolated. Polymer molecular weight was determined using GPC.

Synthetic Example 4

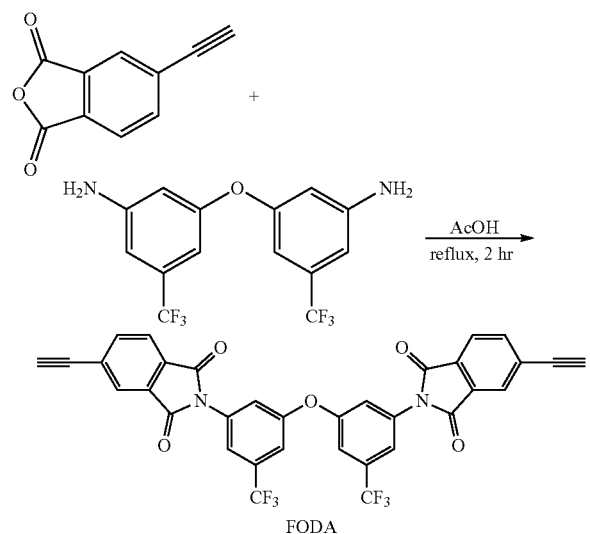

Scheme 1

4-ethynylphthalic anhydride (2.1 eq) and 5,5'-oxybis(3-(trifluoromethyl)aniline) (1 eq) were combined in magnetically stirred acetic acid (0.2 M relative to 5,5'-oxybis(3-(trifluoromethyl)aniline)) in a round-bottom flask fitted with a Claisen adapter. The Claisen adapter was fitted with a dry ice-cooled condensation trap with a positive pressure of nitrogen applied to the inlet at the top of the condenser, and a thermometer adapter with thermocouple extending into the stirred reaction mixture. The reaction mixture was next heated to reflux (118° C.) and held at reflux for two hours. The reaction mixture was cooled to room temperature, transferred to a separatory funnel and slowly dripped into room temperature deionized water. A solid precipitate was vacuum filtered from the suspension mixture and resuspended in deionized water and stirred for 30 minutes. The suspension was vacuum filtered, and the resulting solid was suspended, washed again with stirring for 30 minutes and vacuum filtered, yielding 2,2'-(oxybis(5-(trifluoromethyl)-3,1-phenylene))bis(5-ethynylisoindoline-1,3-dione) (FODA) (96.71% yield). The cake-like solid was dried in an 80° C. vacuum oven for 48 hours to remove water and residual acetic acid. Product drying was monitored by $^1$H-NMR which confirmed the presence of the desired product.

A4B2 (1 eq) and FODA (1.1 eq) were combined in GBL in an amount to provide a solution containing 20 wt % solids in a round-bottom flask equipped with a magnetic stir bar, Claisen adapter, dry ice-cooled condensation trap, thermometer adapter and thermocouple as described above. The reaction mixture was next heated to 150° C. under nitrogen atmosphere and maintained at 150° C. for 6 hours, cooled to room temperature and diluted with high purity acetone. The diluted polymer solution was transferred into a separatory funnel and then slowly added dropwise into mechanically stirred, room temperature deionized water. The solid precipitated polymer was vacuum filtered from the suspension mixture and resuspended in deionized water and stirred for 30 minutes. The suspension was vacuum filtered, the solid was suspended and washed again with stirring for 30 minutes and was again vacuum filtered to yield an off-white solid powder. The cake-like solid was dried in a vacuum oven at 80° C. for 48 hours to remove water to yield Polymer D. [Polymer D: $M_n$=13.7 kDa; $M_w$=37 kDa; PDI=2.7].

Synthetic Example 5: Polymer E

The synthetic procedure used to prepare Polymer B as above was followed and additionally included

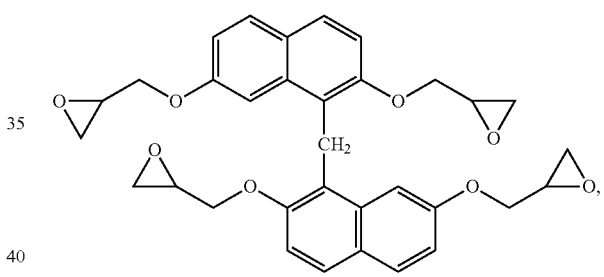

a tetra-epoxide naphthalene-based crosslinker at 15 wt % and

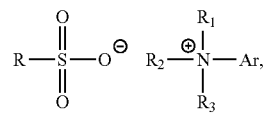

a thermal acid generator, obtained from King Industries, at 5 wt %.

Synthetic Examples 6-12

The synthetic procedure used to prepare Polymer C as above was followed and additionally included crosslinkers and thermal acid generators for the polymers in Table 1:

TABLE 1

| Example | Polymer | XL | Wt % XL | TAG | Wt % TAG |
| --- | --- | --- | --- | --- | --- |
| 6 | F | 1 | 20 | TAG1 | 2 |
| 7 | G | 2 | 5 | TAG1 | 0.5 |
| 8 | H | 2 | 10 | TAG1 | 1 |

TABLE 1-continued

| Example | Polymer | XL | Wt % XL | TAG | Wt % TAG |
|---|---|---|---|---|---|
| 9 | I | 2 | 15 | TAG1 | 1.5 |
| 10 | J | 2 | 5 | TAG2 | 5 |
| 11 | K | 2 | 10 | TAG2 | 5 |
| 12 | L | 2 | 15 | TAG2 | 5 |
| 13 | E | 2 | 15 | TAG2 | 5 |

Compositions including cross-linkers and thermal acid generators which allow effective curing at lower temperatures, where the crosslinkers used are:

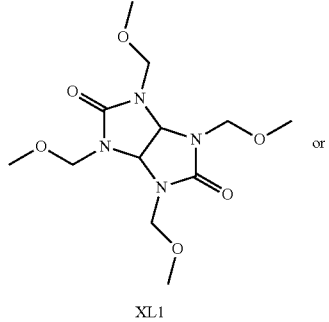

XL1

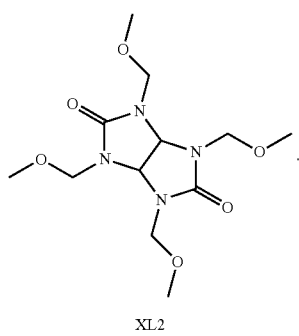

XL2

Comparative Synthetic Example 1

DPO-CPD (109.42 g) and 1,3-diethynylbenzene (18.34 g) were added to a 1 L OptiMax reactor (glass lined, with TEFLON™ fluoropolymer drainage plug). Ethoxybenzene solvent (309 g) was added to form a deep maroon heterogeneous mixture. The reactor was transferred to an OptiMax Synthesis Workstation and sealed under an atmosphere of nitrogen gas. To the reactor top were affixed a stirring rod with a 4-paddle stirrer (elevated to 1 cm from the reactor bottom), a water-cooled reflux condenser, an internal thermocouple (placed at the median depth of the mixture, radially disposed halfway between the stirring shaft and the reactor wall), and a 1-cm baffle (placed perpendicular and adjacent to the outer wall of the reactor). The reactor was set to an internal temperature of 25° C. and stirring was initiated at 100 rpm to mix the heterogeneous contents. After a 30-minute equilibration period at 25° C., the reactor was warmed at a rate of 1° C./min. until reaching an internal temperature of 115 to 135° C. The reactor was maintained at target temperature for a period of 18 hours. The reactor was then cooled to 25° C. at a rate of 1° C./min. The contents of the reactor were then transferred through the outlet at the bottom of the reactor to a bottle, yielding Comparative Polymer 1. [Comparative Polymer 1: $M_n$=37.02 kDa; $M_W$=105.95 kDa; PDI=2.86].

Comparative Synthetic Example 2

A 4-liter cylindrical reactor was charged with 485.010 g diphenylene oxide bis(triphenylcyclopentadienone) (DPO-CPD), 27.370 g of 3,5-diethynylbenzoic acid (DEBzOH), and 2422 g of γ-butyrolactone (GBL) at room temperature. The top of the flask was then equipped with a dry ice condenser, a thermocouple with a temperature controller, $N_2$ inlets, and a stir system. The reactor was placed into a fitted heating mantle. The system was evacuated and purged three times with $N_2$ to remove air from the vessel, which was subsequently blanketed with a constant flow of $N_2$. The reaction system was then heated to an internal temperature of 135° C. After 1 hour, the system was allowed to cool to 90° C., followed by adding a second aliquot (27.780 g) of DEBzOH to the flask, together with an additional 300 g of GBL. The reaction mixture was again heated to 135° C. and kept at this temperature for 1 hour. The system was again allowed to cool to 90° C., followed by adding a third aliquot (27.110 g, 0.25 equivalents) of DEBzOH to the flask, along with an additional 330 g GBL. The reaction mixture was again heated to 135° C. and kept at this temperature for 1 hour, after which time the system was again allowed to cool to 90° C., followed by adding a fourth aliquot (30.763 g, 0.29 equivalents) of DEBzOH to the flask, together with an additional 330 g GBL. The reaction mixture was again heated to 135° C. and kept at this temperature for 6 hours. The reaction mixture was then cooled to room temperature. The resulting diethynylbenzoic acid-biscyclopentadienyl polyarylene polymer was isolated from the reaction mixture by precipitating it from solution by adding isopropanol at room temperature, filtered, and washed with additional isopropanol before the filtrate was dried at 70° C. for 24 hours, yielding Comparative Polymer 2. [Comparative Polymer 2: $M_n$=10.26 kDa; $M_w$=21.33 kDa; PDI=2.08].

Comparative Synthetic Example 3

Compound 1 monomer (2.000 g, 2.965 mmol, 1.1 eq.) and DPO-CPD (2.110 g, 2.696 mmol, 1 eq.) were combined with 16 mL gamma-butryolactone (GBL) in a 50-mL round-bottom flask equipped with a magnetic stir bar under nitrogen atmosphere. The round-bottom flask was fitted with a Claisen adapter affixed with a thermometer probe extending into the reaction mixture and a water-cooled condenser fitted to the side arm. The mixture temperature was increased with magnetic stirring to 150° C. for 24 hr using a thermostatic temperature controller. After cooling to room temperature, the reaction mixture was diluted to 4 times the original volume with acetone.

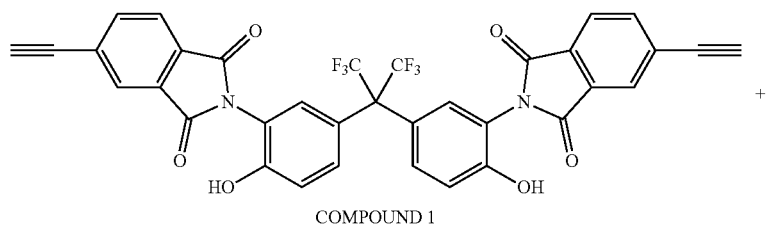

COMPOUND 1

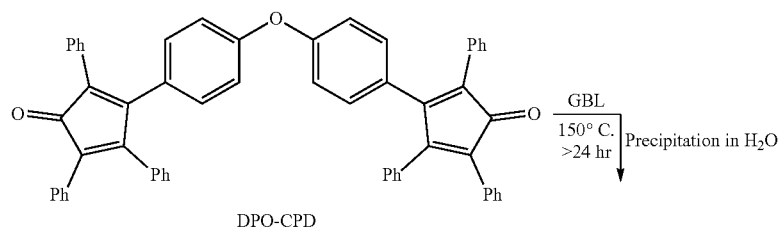

DPO-CPD

GBL
150° C.
>24 hr ] Precipitation in H₂O

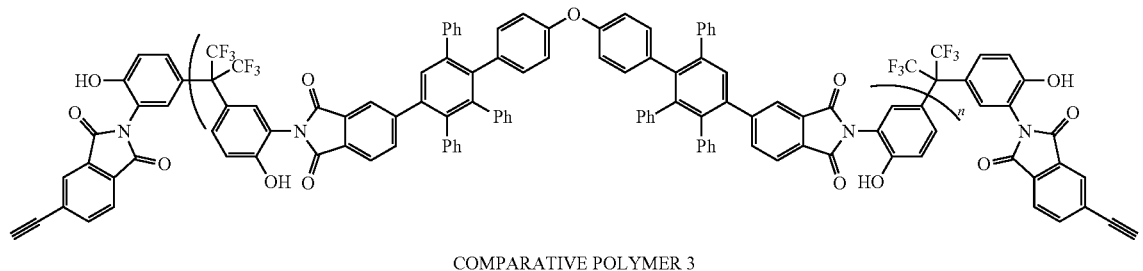

COMPARATIVE POLYMER 3

Solid polymer was precipitated slowly by dripping the diluted solution via separatory funnel into 200-mL of stirred room-temperature deionized water. The resulting cloudy suspension of solid polymer was vacuum filtered to provide the wet solid polymer that was washed with 500-mL room-temperature deionized water by stirring in a 1-L beaker for 1 hour. The solids were vacuum filtered, placed in a 60° C. heated vacuum oven, and dried under high vacuum for 48 hours. The dried Comparative Polymer 3 (3.358 g) was isolated. Polymer molecular weight was determined using GPC.

Coating Preparation

Coupons for coating were cut as 1 in×1 in squares from a Si wafer. The coupons were then wiped down with a Kimwipe™ wetted with acetone. Each coupon was then placed onto a Laurell spincoater model WS650MZ-8NPPB. The vacuum pump and nitrogen line were both turned on and a vacuum was pulled on the sample by pressing the vacuum button on the coater. 2-mL of the sample was dispensed onto the coupon and then the sample was spun at either 1500 or 1000 RPM for 30 seconds. Lower-temperature curing was performed after sample was complete by placing the coated substrate on a Tory Scientific Pines Programmable Hot Plate HP61 at 200° C. for five minutes to cure. This was the procedure typically used for polymeric compositions that included a crosslinker and/or a thermal acid generator. In the absence of such species, curing was performed on coated substrates by using a belt furnace under an atmosphere of flowing nitrogen gas.

Optical Thin Film Preparation

Optical films were prepared by coating Eagle Glass coupons cut as 1.5×1.5 in squares. The coupons were first wiped down with a Kimwipe™ wetted with acetone. Each coupon was then placed onto a Laurell spincoater model WS650MZ-8NPPB. The vacuum pump and nitrogen line were both turned on and a vacuum was pulled on the sample by pressing the vacuum button on the coater. A 1-mL portion of the sample that had been filtered through a 0.2 micron Teflon® filter was dispensed onto the coupon and then the sample was spun at either 1500 or 1000 RPM for 30 seconds. Lower-temperature curing was performed after sample was done spinning by placing it on a Tory Scientific Pines Programmable Hot Plate HP61 at 90-100° C. for 1 minute then at 200° C. for five minutes to cure. This was the procedure typically used for polymeric compositions that included a crosslinker and/or a thermal acid generator. In the absence of such species, curing was performed on coated substrates or optical films by using a belt furnace under an atmosphere of flowing nitrogen gas.

The polymers, coatings, and optical thin films prepared as disclosed herein were characterized using either an alpha-SE®, Metricon, or FIlmetrics single-spot instrument to measure coating/film thickness refractive indices. Refractive indices were generally measured at 550 nm. The results for various curing conditions are presented in Table 2 and Table 3. Corresponding results for comparative coatings/films are presented in Table 4.

TABLE 2

Refractive indices of Polymers A-D before/after curing under the conditions listed in the first column.

| Cure Temp./Time (° C./min) | Polymer A | Polymer B | Polymer C | Polymer D |
|---|---|---|---|---|
| 200/30 | 1.737225/1.732061 | 1.711625/1.707256 | 1.70444/1.703451 | 1.711996/1.70434 |
| 250/30 | 1.736474/1.728783 | 1.710814/1.699946 | 1.70474/1.702024 | 1.709866/1.699193 |
| 300/30 | 1.734982/1.722126 | 1.710541/1.690508 | 1.704003/1.695737 | 1.711074/1.692916 |
| 350/30 | 1.737945/1.704876 | 1.710633/1.677794 | 1.704948/1.682124 | 1.710501/1.677468 |
| 400/30 | 1.736651/1.678762 | 1.711706/1.657572 | nmd/nmd | 1.711257/1.658102 |
| 450/30 | 1.735751/1.673384 | 1.710355/1.654927 | 1.709948/1.654209 | 1.71145/1.649782 | nmd = no measurement data under these cure conditions.

The as-cast coatings or films all had thicknesses ranging from about 75 nm to about 250 nm which are generally observed to thicken upon curing at higher temperatures in the ranges studied. The refractive indices through these same thermal-treatment ranges are generally decrease as the curing temperature increases. For optical-device use, in particular for minimizing losses that can occur as a result of refractive index mismatch between adjacent device layers, these materials offer the synthetic flexibility that arises from their completely-organic character along with the ability to fine-tune to a specific, desired refractive index via curing for particular applications or device configurations.

TABLE 3

Compositions of the present disclosure that include a crosslinker and thermal acid generator can also be used to generate coatings and optical thin films with refractive indices in target regions for the uses disclosed herein under more mild curing conditions.

| Example | Polymer | Cure Temp/Time (° C./min) | Post-Cure RI |
|---|---|---|---|
| 5 | E | 200/5 | 1.711 |
| 6 | F | 200/5 | 1.689 |
| 7 | G | 200/5 | 1.684 |
| 8 | H | 200/5 | 1.687 |
| 9 | I | 200/5 | 1.686 |
| 10 | J | 200/5 | 1.681 |
| 11 | K | 200/5 | 1.684 |
| 12 | L | 200/5 | 1.683 |

TABLE 4

Refractive indices of Comparative Polymers 1-4 before/after curing under the conditions listed in the first column.

| Cure Temp./Time (° C./min) | Comparative Polymer 1 | Comparative Polymer 2 | Comparative Polymer 3 | Comparative Polymer 4 |
|---|---|---|---|---|
| 200/30 | 1.659871/1.65449 | 1.665954/1.660287 | 1.653475/1.656932 | 1.65962/1.656523 |
| 250/30 | 1.654105/1.649511 | 1.662785/1.658922 | 1.654391/1.652018 | 1.659499/1.654638 |
| 300/30 | 1.6546/1.641744 | 1.664113/1.653654 | 1.653785/1.642407 | 1.659582/1.651899 |
| 350/30 | 1.657975/1.639776 | 1.665426/1.648783 | 1.653663/1.640764 | 1.661684/1.646176 |
| 400/30 | 1.655286/1.639549 | 1.664753/1.648359 | 1.653686/1.646632 | 1.661905/1.638366 |
| 450/30 | 1.654336/1.641309 | 1.664797/1.659441 | 1.654384/1.663642 | 1.660287/1.641281 |

It can be seen that the comparative materials exhibit no refractive index tunability under the curing conditions disclosed herein.

Fourier Transform Infrared (FTIR) Spectroscopy Characterization

FTIR spectroscopy of thin films on diced (1 inch×1 inch) silicon wafers were taken using a Thermo Scientific Nicolet iS5 instrument fitted with a Harrick Scientific Brewster angle set up. All baselines were taken of unmodified bare silicon wafers cut from the same wafer as the polymer-functionalized wafers. The spectra were recorded between 4000 and 400 $cm^{-1}$. The total peak area (peak integrals) from 1480 to 1522 $cm^{-1}$ and total peak area from 1648 to 1690 $cm^{-1}$ were determined. The ratios of the latter peak area to the former peak area for the samples were determined and are set forth in Table 5.

Raman Spectroscopy Characterization

Raman spectroscopy measurements were made using a Horiba LabRam HR Raman microscope using 633 nm excitation with a 300 gr/mm grating. Measurements were made using a 100× objective (Olympus Mplan-100×, NA 0.9). The total peak area (peak integrals) from 2190 to 2250 cm-1 and total peak area from 1550 to 1650 cm-1 were determined. The ratios of the former peak area to the latter peak area for the samples were determined and are set forth in Table 5.

TABLE 5

| Polymer | Cure Temp/Time (° C./min) | Cure Ambient | *FTIR Peak Area Ratio | **Raman Peak Area Ratio |
|---|---|---|---|---|
| A | 350/60 | Air | 1.124 | NMF |
| A | 350/60 | $N_2$ | 0.086 | 0.654 |

TABLE 5-continued

| Polymer | Cure Temp/Time (° C./min) | Cure Ambient | *FTIR Peak Area Ratio | **Raman Peak Area Ratio |
|---|---|---|---|---|
| A | 325/60 | Air | 0.625 | 0.661 |
| A | 325/60 | N$_2$ | 0.051 | 0.978 |
| A | 300/60 | Air | 0.125 | 1.072 |
| A | 300/60 | N$_2$ | 0.052 | 1.073 |
| A | 250/60 | Air | 0.063 | 1.142 |
| A | 250/60 | N$_2$ | 0.064 | 1.134 |
| B | 350/60 | air | 1.408 | NMF |
| B | 350/60 | N$_2$ | 0.142 | 0.592 |
| D | 350/60 | air | 0.954 | NMF |
| D | 350/60 | N$_2$ | 0.097 | 0.563 |
| Comparative 1 | 350/60 | air | 0 | NMP |
| Comparative 1 | 350/60 | N$_2$ | 0 | NMP |
| Comparative 2 | 350/60 | air | 0.108 | NMP |
| Comparative 2 | 350/60 | N$_2$ | 0.420 | NMP |
| Comparative 4 | 350/60 | air | 0.484 | nmd |
| Comparative 4 | 350/60 | N$_2$ | 0.078 | nmd |

*ratio of total FTIR peak area (peak integrals) at 1648-1690 cm$^{-1}$ to total peak area at 1480-1522 cm$^{-1}$;
**ratio of total Raman peak area at 2190-2250 cm$^{-1}$ to total peak area at 1550-1650 cm$^{-1}$;
NMP = not measured as no functional groups have peaks in the measured ranges;
NMF = not measurable due to fluorescence effects;
nmd = no measurement data made for sample.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A coating comprising a polymeric layer, wherein the polymeric layer comprises a reaction product of a first monomer comprising two or more aromatic acetylene groups and a second monomer comprising two or more cyclopentadienone groups, or a cured product of the reaction product, wherein the first monomer comprising two or more aromatic acetylene groups is

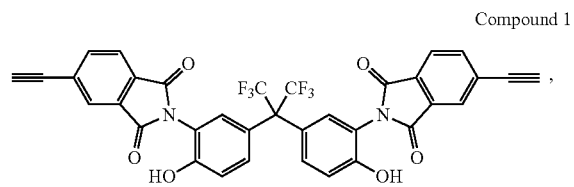 [SMILES: C#Cc1ccc2c(c1)C(=O)N(c1cc(C(c3ccc(O)c(N4C(=O)c5ccc(C#C)cc5C4=O)c3)(C(F)(F)F)C(F)(F)F)ccc1O)C2=O]

Compound 1 and wherein the coating additionally comprises a cross-linker.

2. The coating according to claim 1, wherein the second monomer comprising the two or more cyclopentadienone moieties has Formula 3:

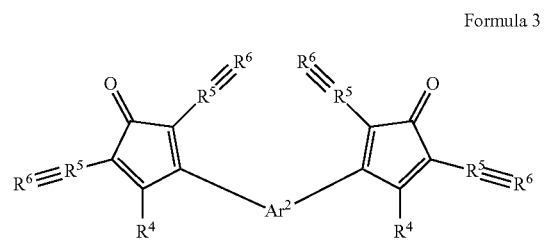

Formula 3 wherein: each R$^4$ is independently H, substituted or unsubstituted C$_{1-6}$ alkyl, substituted or unsubstituted C$_{6-20}$ aryl, or substituted or unsubstituted C$_{4-20}$ heteroaryl; R$^5$ is substituted or unsubstituted C$_{6-20}$ aryl, or substituted or unsubstituted C$_{4-20}$ heteroaryl; R$^6$ is independently substituted or unsubstituted C$_{1-6}$ alkyl, substituted or unsubstituted $C_{6-20}$ aryl, or substituted or unsubstituted $C_{4-20}$ heteroaryl; and $Ar^2$ is an aromatic moiety.

3. The coating according to claim 2, wherein $Ar^2$ has Formula 4:

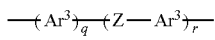

Formula 4 wherein: Z is the same or different at each occurrence and selected from the group consisting of a single covalent bond, an alkyl group, O, C(O), C(S), $CF_2$, and $C(CF_3)_2$; q is an integer from 1 to 3; r is an integer from 0 to 2; and $Ar^3$ is the same or different at each occurrence and is selected from the group consisting of Formula 5 and Formula 6:

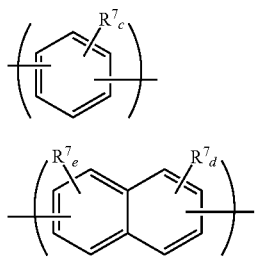

Formula 5

Formula 6 wherein: $R^7$ is the same or different at each occurrence and is selected from the group consisting of halogen, substituted or unsubstituted $C_{1-6}$ alkyl, aryl, and aryloxy; c is an integer from 0 to 4; and d and e are the same or different at each occurrence and are each an integer from 0 to 3.

4. The coating according to claim 1, wherein the crosslinker is a glycoluril compound.

5. The coating according to claim 4, wherein a weight percentage of the crosslinker in the polymeric layer is between 5% and 20%.

6. The coating according to claim 1, wherein the polymeric layer comprises the cured product of the reaction product and the cured product of the reaction product is formed by curing the reaction product at a temperature between 200° C. and 300° C.

7. The coating according to claim 6, wherein the reaction product is cured for a time greater than or equal to 5 minutes.

8. The coating according to claim 1, wherein the second monomer comprising two or more cyclopentadienone groups is

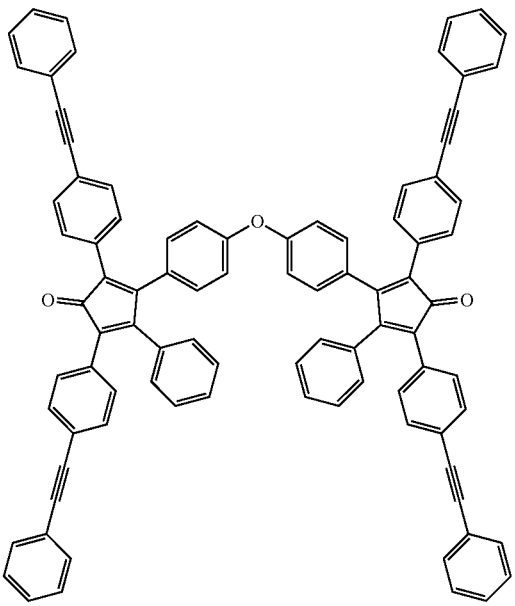

Compound 30

9. The coating according to claim 8, wherein the crosslinker is

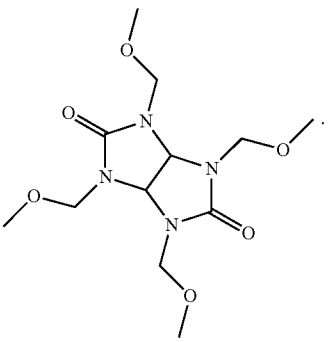

XL1

10. An optical thin film comprising the polymeric layer of claim 1.

11. A display device comprising the optical thin film of claim 10.

* * * * *